United States Patent
Gutman

(10) Patent No.: US 9,357,551 B2
(45) Date of Patent: May 31, 2016

(54) SYSTEMS AND METHODS FOR SIMULTANEOUS SAMPLING OF SERIAL DIGITAL DATA STREAMS FROM MULTIPLE ANALOG-TO-DIGITAL CONVERTERS (ADCS), INCLUDING IN DISTRIBUTED ANTENNA SYSTEMS

(71) Applicant: CORNING OPTICAL COMMUNICATIONS WIRELESS LTD., Airport City, IL (US)

(72) Inventor: Amit Gutman, Tel-Aviv (IL)

(73) Assignee: Corning Optical Communications Wireless Ltd, Airport City (IL)

( * ) Notice: Subject to any disclaimer, the term of this patent is extended or adjusted under 35 U.S.C. 154(b) by 52 days.

(21) Appl. No.: 14/291,356

(22) Filed: May 30, 2014

(65) Prior Publication Data

US 2015/0351088 A1 Dec. 3, 2015

(51) Int. Cl.
*H03M 1/12* (2006.01)
*H04W 72/04* (2009.01)
*H04W 88/08* (2009.01)

(52) U.S. Cl.
CPC ............ *H04W 72/048* (2013.01); *H03M 1/123* (2013.01); *H03M 1/1245* (2013.01); *H04W 72/0446* (2013.01); *H04W 88/085* (2013.01)

(58) Field of Classification Search
CPC ..................... H04B 10/25758; H04B 10/2507; H04B 10/25753; H04B 10/07955; Y02B 60/1221; G06F 1/3237; G06F 1/32; G06F 13/10
See application file for complete search history.

(56) References Cited

U.S. PATENT DOCUMENTS

| | | | |
|---|---|---|---|
| 4,365,865 | A | 12/1982 | Stiles |
| 4,449,246 | A | 5/1984 | Seiler et al. |
| 4,573,212 | A | 2/1986 | Lipsky |

(Continued)

FOREIGN PATENT DOCUMENTS

| | | |
|---|---|---|
| AU | 545192 B | 10/1992 |
| AU | 731180 B2 | 3/1998 |

(Continued)

OTHER PUBLICATIONS

Attygalle et al., "Extending Optical Transmission Distance in Fiber Wireless Links Using Passive Filtering in conjunction with Optimized Modulation," Journal of Lightwave Technology, vol. 24, No. 4, Apr. 2006, 7 pages.

(Continued)

*Primary Examiner* — Jung-Jen Liu
(74) *Attorney, Agent, or Firm* — C. Keith Montgomery

(57) ABSTRACT

Systems and methods for simultaneous sampling of serial digital data streams from multiple analog-to-digital converters (ADCs), including in distributed antenna systems, are disclosed. In one embodiment, a controller unit samples a plurality of serial digital data streams simultaneously. To allow the controller unit to sample the multiple serial digital data streams simultaneously from a plurality of ADCs, the controller unit is configured to provide a plurality of data input ports. Each of the ADCs is coupled to a common chip select port and clock signal port on the controller unit. The controller unit communicates a chip select signal on the chip select port to activate all of the ADCs simultaneously to cause each of the ADCs to provide its respective digital data stream to the respective data input port of the controller unit simultaneously for sampling. As a result, fewer or lower-cost components may be used to sample multiple ADCs.

24 Claims, 9 Drawing Sheets

(56) References Cited

U.S. PATENT DOCUMENTS

| | | | |
|---|---|---|---|
| 4,665,560 A | 5/1987 | Lange | |
| 4,867,527 A | 9/1989 | Dolt et al. | |
| 4,889,977 A | 12/1989 | Haydon | |
| 4,896,939 A | 1/1990 | O'Brien | |
| 4,916,460 A | 4/1990 | Powell | |
| 4,939,852 A | 7/1990 | Brenner | |
| 4,972,346 A | 11/1990 | Kawano et al. | |
| 5,039,195 A | 8/1991 | Jenkins et al. | |
| 5,042,086 A | 8/1991 | Cole et al. | |
| 5,056,109 A | 10/1991 | Gilhousen et al. | |
| 5,059,927 A | 10/1991 | Cohen | |
| 5,099,239 A * | 3/1992 | Bruce | H01L 27/0805 257/E27.048 |
| 5,125,060 A | 6/1992 | Edmundson | |
| 5,187,803 A | 2/1993 | Sohner et al. | |
| 5,189,718 A | 2/1993 | Barrett et al. | |
| 5,189,719 A | 2/1993 | Coleman et al. | |
| 5,206,655 A | 4/1993 | Caille et al. | |
| 5,208,812 A | 5/1993 | Dudek et al. | |
| 5,210,812 A | 5/1993 | Nilsson et al. | |
| 5,260,957 A | 11/1993 | Hakimi | |
| 5,263,108 A | 11/1993 | Kurokawa et al. | |
| 5,267,122 A | 11/1993 | Glover et al. | |
| 5,268,971 A | 12/1993 | Nilsson et al. | |
| 5,278,690 A | 1/1994 | Vella-Coleiro | |
| 5,278,989 A | 1/1994 | Burke et al. | |
| 5,280,472 A | 1/1994 | Gilhousen et al. | |
| 5,299,947 A | 4/1994 | Barnard | |
| 5,301,056 A | 4/1994 | O'Neill | |
| 5,325,223 A | 6/1994 | Bears | |
| 5,339,058 A | 8/1994 | Lique | |
| 5,339,184 A | 8/1994 | Tang | |
| 5,343,320 A | 8/1994 | Anderson | |
| 5,377,035 A | 12/1994 | Wang et al. | |
| 5,379,455 A | 1/1995 | Koschek | |
| 5,381,459 A | 1/1995 | Lappington | |
| 5,396,224 A | 3/1995 | Dukes et al. | |
| 5,400,391 A | 3/1995 | Emura et al. | |
| 5,420,863 A | 5/1995 | Taketsugu et al. | |
| 5,424,864 A | 6/1995 | Emura | |
| 5,444,564 A | 8/1995 | Newberg | |
| 5,457,557 A | 10/1995 | Zarem et al. | |
| 5,459,727 A | 10/1995 | Vannucci | |
| 5,469,523 A | 11/1995 | Blew et al. | |
| 5,519,830 A | 5/1996 | Opoczynski | |
| 5,543,000 A | 8/1996 | Lique | |
| 5,546,443 A | 8/1996 | Raith | |
| 5,557,698 A | 9/1996 | Gareis et al. | |
| 5,574,815 A | 11/1996 | Kneeland | |
| 5,585,802 A * | 12/1996 | Cabler | G10H 1/0066 341/143 |
| 5,598,288 A | 1/1997 | Collar | |
| 5,606,725 A | 2/1997 | Hart | |
| 5,615,034 A | 3/1997 | Hori | |
| 5,627,879 A | 5/1997 | Russell et al. | |
| 5,640,678 A | 6/1997 | Ishikawa et al. | |
| 5,642,405 A | 6/1997 | Fischer et al. | |
| 5,644,622 A | 7/1997 | Russell et al. | |
| 5,648,961 A | 7/1997 | Ebihara | |
| 5,651,081 A | 7/1997 | Blew et al. | |
| 5,657,374 A | 8/1997 | Russell et al. | |
| 5,668,562 A | 9/1997 | Cutrer et al. | |
| 5,677,974 A | 10/1997 | Elms et al. | |
| 5,682,256 A | 10/1997 | Motley et al. | |
| 5,694,232 A | 12/1997 | Parsay et al. | |
| 5,703,602 A | 12/1997 | Casebolt | |
| 5,708,681 A | 1/1998 | Malkemes et al. | |
| 5,726,984 A | 3/1998 | Kubler et al. | |
| 5,765,099 A | 6/1998 | Georges et al. | |
| 5,790,536 A | 8/1998 | Mahany et al. | |
| 5,790,606 A | 8/1998 | Dent | |
| 5,793,772 A | 8/1998 | Burke et al. | |
| 5,802,173 A | 9/1998 | Hamilton-Piercy et al. | |
| 5,802,473 A | 9/1998 | Rutledge et al. | |
| 5,805,975 A | 9/1998 | Green, Sr. et al. | |
| 5,805,983 A | 9/1998 | Naidu et al. | |
| 5,809,395 A | 9/1998 | Hamilton-Piercy et al. | |
| 5,809,431 A | 9/1998 | Bustamante et al. | |
| 5,812,296 A | 9/1998 | Tarusawa et al. | |
| 5,818,619 A | 10/1998 | Medved et al. | |
| 5,818,883 A | 10/1998 | Smith et al. | |
| 5,821,510 A | 10/1998 | Cohen et al. | |
| 5,825,651 A | 10/1998 | Gupta et al. | |
| 5,838,474 A | 11/1998 | Stilling | |
| 5,839,052 A | 11/1998 | Dean et al. | |
| 5,852,651 A | 12/1998 | Fischer et al. | |
| 5,854,986 A | 12/1998 | Dorren et al. | |
| 5,859,719 A | 1/1999 | Dental et al. | |
| 5,862,460 A | 1/1999 | Rich | |
| 5,867,485 A | 2/1999 | Chambers et al. | |
| 5,867,763 A | 2/1999 | Dean et al. | |
| 5,881,200 A | 3/1999 | Burt | |
| 5,883,882 A | 3/1999 | Schwartz | |
| 5,896,568 A | 4/1999 | Tseng et al. | |
| 5,903,834 A | 5/1999 | Wallstedt et al. | |
| 5,910,776 A | 6/1999 | Black | |
| 5,913,003 A | 6/1999 | Arroyo et al. | |
| 5,917,636 A | 6/1999 | Wake et al. | |
| 5,930,682 A | 7/1999 | Schwartz et al. | |
| 5,936,754 A | 8/1999 | Ariyavisitakul et al. | |
| 5,943,372 A | 8/1999 | Gans et al. | |
| 5,946,622 A | 8/1999 | Bojeryd | |
| 5,949,564 A | 9/1999 | Wake | |
| 5,953,670 A | 9/1999 | Newson | |
| 5,959,531 A | 9/1999 | Gallagher, III et al. | |
| 5,960,344 A | 9/1999 | Mahany | |
| 5,969,837 A | 10/1999 | Farber et al. | |
| 5,983,070 A | 11/1999 | Georges et al. | |
| 5,987,303 A | 11/1999 | Dutta et al. | |
| 6,005,884 A | 12/1999 | Cook et al. | |
| 6,006,069 A | 12/1999 | Langston et al. | |
| 6,006,105 A | 12/1999 | Rostoker et al. | |
| 6,011,980 A | 1/2000 | Nagano et al. | |
| 6,014,546 A | 1/2000 | Georges et al. | |
| 6,016,426 A | 1/2000 | Bodell | |
| 6,023,625 A | 2/2000 | Myers, Jr. | |
| 6,037,898 A | 3/2000 | Parish et al. | |
| 6,061,161 A | 5/2000 | Yang et al. | |
| 6,069,721 A | 5/2000 | Oh et al. | |
| 6,088,381 A | 7/2000 | Myers, Jr. | |
| 6,118,767 A | 9/2000 | Shen et al. | |
| 6,122,529 A | 9/2000 | Sabat, Jr. et al. | |
| 6,127,917 A | 10/2000 | Tuttle | |
| 6,128,470 A | 10/2000 | Naidu et al. | |
| 6,128,477 A | 10/2000 | Freed | |
| 6,148,041 A | 11/2000 | Dent | |
| 6,150,921 A | 11/2000 | Werb et al. | |
| 6,157,810 A | 12/2000 | Georges et al. | |
| 6,192,216 B1 | 2/2001 | Sabat, Jr. et al. | |
| 6,194,968 B1 | 2/2001 | Winslow | |
| 6,212,397 B1 | 4/2001 | Langston et al. | |
| 6,222,503 B1 | 4/2001 | Gietema | |
| 6,223,201 B1 | 4/2001 | Reznak | |
| 6,232,870 B1 | 5/2001 | Garber et al. | |
| 6,236,789 B1 | 5/2001 | Fitz | |
| 6,236,863 B1 | 5/2001 | Waldroup et al. | |
| 6,240,274 B1 | 5/2001 | Izadpanah | |
| 6,246,500 B1 | 6/2001 | Ackerman | |
| 6,268,946 B1 | 7/2001 | Larkin et al. | |
| 6,275,990 B1 | 8/2001 | Dapper et al. | |
| 6,279,158 B1 | 8/2001 | Geile et al. | |
| 6,286,163 B1 | 9/2001 | Trimble | |
| 6,292,673 B1 | 9/2001 | Maeda et al. | |
| 6,295,451 B1 | 9/2001 | Mimura | |
| 6,301,240 B1 | 10/2001 | Slabinski et al. | |
| 6,307,869 B1 | 10/2001 | Pawelski | |
| 6,314,163 B1 | 11/2001 | Acampora | |
| 6,317,599 B1 | 11/2001 | Rappaport et al. | |
| 6,323,980 B1 | 11/2001 | Bloom | |
| 6,324,391 B1 | 11/2001 | Bodell | |
| 6,330,241 B1 | 12/2001 | Fort | |
| 6,330,244 B1 | 12/2001 | Swartz et al. | |
| 6,334,219 B1 | 12/2001 | Hill et al. | |
| 6,336,021 B1 | 1/2002 | Nukada | |

(56) References Cited

U.S. PATENT DOCUMENTS

| | | |
|---|---|---|
| 6,336,042 B1 | 1/2002 | Dawson et al. |
| 6,337,754 B1 | 1/2002 | Imajo |
| 6,340,932 B1 | 1/2002 | Rodgers et al. |
| 6,353,406 B1 | 3/2002 | Lanzl et al. |
| 6,353,600 B1 | 3/2002 | Schwartz et al. |
| 6,359,714 B1 | 3/2002 | Imajo |
| 6,370,203 B1 | 4/2002 | Boesch et al. |
| 6,374,078 B1 | 4/2002 | Williams et al. |
| 6,374,124 B1 | 4/2002 | Slabinski |
| 6,389,010 B1 | 5/2002 | Kubler et al. |
| 6,400,318 B1 | 6/2002 | Kasami et al. |
| 6,400,418 B1 | 6/2002 | Wakabayashi |
| 6,404,775 B1 | 6/2002 | Leslie et al. |
| 6,405,018 B1 | 6/2002 | Reudink et al. |
| 6,405,058 B2 | 6/2002 | Bobier |
| 6,405,308 B1 | 6/2002 | Gupta et al. |
| 6,414,624 B2 | 7/2002 | Endo et al. |
| 6,415,132 B1 | 7/2002 | Sabat, Jr. |
| 6,421,327 B1 | 7/2002 | Lundby et al. |
| 6,438,301 B1 | 8/2002 | Johnson et al. |
| 6,438,371 B1 | 8/2002 | Fujise et al. |
| 6,448,558 B1 | 9/2002 | Greene |
| 6,452,915 B1 | 9/2002 | Jorgensen |
| 6,459,519 B1 | 10/2002 | Sasai et al. |
| 6,459,989 B1 | 10/2002 | Kirkpatrick et al. |
| 6,477,154 B1 | 11/2002 | Cheong et al. |
| 6,480,702 B1 | 11/2002 | Sabat, Jr. |
| 6,486,907 B1 | 11/2002 | Farber et al. |
| 6,496,290 B1 | 12/2002 | Lee |
| 6,501,965 B1 | 12/2002 | Lucidarme |
| 6,504,636 B1 | 1/2003 | Seto et al. |
| 6,504,831 B1 | 1/2003 | Greenwood et al. |
| 6,512,478 B1 | 1/2003 | Chien |
| 6,519,395 B1 | 2/2003 | Bevan et al. |
| 6,519,449 B1 | 2/2003 | Zhang et al. |
| 6,525,855 B1 | 2/2003 | Westbrook et al. |
| 6,535,330 B1 | 3/2003 | Lelic et al. |
| 6,535,720 B1 | 3/2003 | Kintis et al. |
| 6,556,551 B1 | 4/2003 | Schwartz |
| 6,577,794 B1 | 6/2003 | Currie et al. |
| 6,577,801 B2 | 6/2003 | Broderick et al. |
| 6,580,402 B2 | 6/2003 | Navarro et al. |
| 6,580,905 B1 | 6/2003 | Naidu et al. |
| 6,580,918 B1 | 6/2003 | Leickel et al. |
| 6,583,763 B2 | 6/2003 | Judd |
| 6,587,514 B1 | 7/2003 | Wright et al. |
| 6,594,496 B2 | 7/2003 | Schwartz |
| 6,597,325 B2 | 7/2003 | Judd et al. |
| 6,598,009 B2 | 7/2003 | Yang |
| 6,606,430 B2 | 8/2003 | Bartur et al. |
| 6,615,074 B2 | 9/2003 | Mickle et al. |
| 6,628,732 B1 | 9/2003 | Takaki |
| 6,634,811 B1 | 10/2003 | Gertel et al. |
| 6,636,747 B2 | 10/2003 | Harada et al. |
| 6,640,103 B1 | 10/2003 | Inman et al. |
| 6,643,437 B1 | 11/2003 | Park |
| 6,652,158 B2 | 11/2003 | Bartur et al. |
| 6,654,590 B2 | 11/2003 | Boros et al. |
| 6,654,616 B1 | 11/2003 | Pope, Jr. et al. |
| 6,657,535 B1 | 12/2003 | Magbie et al. |
| 6,658,269 B1 | 12/2003 | Golemon et al. |
| 6,665,308 B1 | 12/2003 | Rakib et al. |
| 6,670,930 B2 | 12/2003 | Navarro |
| 6,674,966 B1 | 1/2004 | Koonen |
| 6,675,294 B1 | 1/2004 | Gupta et al. |
| 6,678,509 B2 | 1/2004 | Skarman et al. |
| 6,687,437 B1 | 2/2004 | Starnes et al. |
| 6,690,328 B2 | 2/2004 | Judd |
| 6,701,137 B1 | 3/2004 | Judd et al. |
| 6,704,298 B1 | 3/2004 | Matsumiya et al. |
| 6,704,545 B1 | 3/2004 | Wala |
| 6,710,366 B1 | 3/2004 | Lee et al. |
| 6,714,800 B2 | 3/2004 | Johnson et al. |
| 6,731,880 B2 | 5/2004 | Westbrook et al. |
| 6,745,013 B1 | 6/2004 | Porter et al. |
| 6,758,913 B1 | 7/2004 | Tunney et al. |
| 6,763,226 B1 | 7/2004 | McZeal, Jr. |
| 6,771,862 B2 | 8/2004 | Karnik et al. |
| 6,771,933 B1 | 8/2004 | Eng et al. |
| 6,784,802 B1 | 8/2004 | Stanescu |
| 6,785,558 B1 | 8/2004 | Stratford et al. |
| 6,788,666 B1 | 9/2004 | Linebarger et al. |
| 6,801,767 B1 | 10/2004 | Schwartz et al. |
| 6,807,374 B1 | 10/2004 | Imajo et al. |
| 6,812,824 B1 | 11/2004 | Goldinger et al. |
| 6,812,905 B2 | 11/2004 | Thomas et al. |
| 6,823,174 B1 | 11/2004 | Masenten et al. |
| 6,826,163 B2 | 11/2004 | Mani et al. |
| 6,826,164 B2 | 11/2004 | Mani et al. |
| 6,826,337 B2 | 11/2004 | Linnell |
| 6,836,660 B1 | 12/2004 | Wala |
| 6,836,673 B1 | 12/2004 | Trott |
| 6,842,433 B2 | 1/2005 | West et al. |
| 6,847,856 B1 | 1/2005 | Bohannon |
| 6,850,510 B2 | 2/2005 | Kubler |
| 6,865,390 B2 | 3/2005 | Goss et al. |
| 6,873,823 B2 | 3/2005 | Hasarchi |
| 6,876,056 B2 | 4/2005 | Tilmans et al. |
| 6,879,290 B1 | 4/2005 | Toutain et al. |
| 6,882,311 B2 | 4/2005 | Walker et al. |
| 6,883,710 B2 | 4/2005 | Chung |
| 6,885,344 B2 | 4/2005 | Mohamadi |
| 6,885,846 B1 | 4/2005 | Panasik et al. |
| 6,889,060 B2 | 5/2005 | Fernando et al. |
| 6,909,399 B1 | 6/2005 | Zegelin et al. |
| 6,915,058 B2 | 7/2005 | Pons |
| 6,915,529 B1 | 7/2005 | Suematsu et al. |
| 6,919,858 B2 | 7/2005 | Rofougaran |
| 6,920,330 B2 | 7/2005 | Caronni et al. |
| 6,924,997 B2 | 8/2005 | Chen et al. |
| 6,930,987 B1 | 8/2005 | Fukuda et al. |
| 6,931,183 B2 | 8/2005 | Panak et al. |
| 6,931,659 B1 | 8/2005 | Kinemura |
| 6,931,813 B2 | 8/2005 | Collie |
| 6,933,849 B2 | 8/2005 | Sawyer |
| 6,934,511 B1 | 8/2005 | Lovinggood et al. |
| 6,934,541 B2 | 8/2005 | Miyatani |
| 6,941,112 B2 | 9/2005 | Hasegawa |
| 6,946,989 B2 | 9/2005 | Vavik |
| 6,961,312 B2 | 11/2005 | Kubler et al. |
| 6,963,289 B2 | 11/2005 | Aljadeff et al. |
| 6,963,552 B2 | 11/2005 | Sabat, Jr. et al. |
| 6,965,718 B2 | 11/2005 | Koertel |
| 6,967,347 B2 | 11/2005 | Estes et al. |
| 6,968,107 B2 | 11/2005 | Belardi et al. |
| 6,970,652 B2 | 11/2005 | Zhang et al. |
| 6,973,243 B2 | 12/2005 | Koyasu et al. |
| 6,974,262 B1 | 12/2005 | Rickenbach |
| 6,977,502 B1 | 12/2005 | Hertz |
| 7,002,511 B1 | 2/2006 | Ammar et al. |
| 7,006,465 B2 | 2/2006 | Toshimitsu et al. |
| 7,013,087 B2 | 3/2006 | Suzuki et al. |
| 7,015,826 B1 | 3/2006 | Chan et al. |
| 7,020,473 B2 | 3/2006 | Splett |
| 7,020,488 B1 | 3/2006 | Bleile et al. |
| 7,024,166 B2 | 4/2006 | Wallace |
| 7,035,512 B2 | 4/2006 | Van Bijsterveld |
| 7,039,399 B2 | 5/2006 | Fischer |
| 7,043,271 B1 | 5/2006 | Seto et al. |
| 7,047,028 B2 | 5/2006 | Cagenius et al. |
| 7,050,017 B2 | 5/2006 | King et al. |
| 7,053,838 B2 | 5/2006 | Judd |
| 7,054,513 B2 | 5/2006 | Herz et al. |
| 7,069,577 B2 | 6/2006 | Geile et al. |
| 7,072,586 B2 | 7/2006 | Aburakawa et al. |
| 7,082,320 B2 | 7/2006 | Kattukaran et al. |
| 7,084,769 B2 | 8/2006 | Bauer et al. |
| 7,093,985 B2 | 8/2006 | Lord et al. |
| 7,103,119 B2 | 9/2006 | Matsuoka et al. |
| 7,103,377 B2 | 9/2006 | Bauman et al. |
| 7,106,252 B2 | 9/2006 | Smith et al. |
| 7,106,931 B2 | 9/2006 | Sutehall et al. |
| 7,110,795 B2 | 9/2006 | Doi |
| 7,114,859 B1 | 10/2006 | Tuohimaa et al. |

(56) References Cited

U.S. PATENT DOCUMENTS

| | | |
|---|---|---|
| 7,127,175 B2 | 10/2006 | Mani et al. |
| 7,127,176 B2 | 10/2006 | Sasaki |
| 7,142,503 B1 | 11/2006 | Grant et al. |
| 7,142,535 B2 | 11/2006 | Kubler et al. |
| 7,142,619 B2 | 11/2006 | Sommer et al. |
| 7,146,506 B1 | 12/2006 | Hannah et al. |
| 7,160,032 B2 | 1/2007 | Nagashima et al. |
| 7,171,244 B2 | 1/2007 | Bauman |
| 7,184,728 B2 | 2/2007 | Solum |
| 7,190,748 B2 | 3/2007 | Kim et al. |
| 7,194,023 B2 | 3/2007 | Norrell et al. |
| 7,199,443 B2 | 4/2007 | Elsharawy |
| 7,200,305 B2 | 4/2007 | Dion et al. |
| 7,200,391 B2 | 4/2007 | Chung et al. |
| 7,228,072 B2 | 6/2007 | Mickelsson et al. |
| 7,263,293 B2 | 8/2007 | Ommodt et al. |
| 7,269,311 B2 | 9/2007 | Kim et al. |
| 7,280,011 B2 | 10/2007 | Bayar et al. |
| 7,286,843 B2 | 10/2007 | Scheck |
| 7,286,854 B2 | 10/2007 | Ferrato et al. |
| 7,295,119 B2 | 11/2007 | Rappaport et al. |
| 7,310,430 B1 | 12/2007 | Mallya et al. |
| 7,313,415 B2 | 12/2007 | Wake et al. |
| 7,315,735 B2 | 1/2008 | Graham |
| 7,324,730 B2 | 1/2008 | Varkey et al. |
| 7,343,164 B2 | 3/2008 | Kallstenius |
| 7,348,843 B1 | 3/2008 | Qiu et al. |
| 7,349,633 B2 | 3/2008 | Lee et al. |
| 7,359,408 B2 | 4/2008 | Kim |
| 7,359,674 B2 | 4/2008 | Markki et al. |
| 7,366,150 B2 | 4/2008 | Lee et al. |
| 7,366,151 B2 | 4/2008 | Kubler et al. |
| 7,369,526 B2 | 5/2008 | Lechleider et al. |
| 7,379,669 B2 | 5/2008 | Kim |
| 7,388,892 B2 | 6/2008 | Nishiyama et al. |
| 7,392,025 B2 | 6/2008 | Rooyen et al. |
| 7,392,029 B2 | 6/2008 | Pronkine |
| 7,394,883 B2 | 7/2008 | Funakubo et al. |
| 7,403,156 B2 | 7/2008 | Coppi et al. |
| 7,409,159 B2 | 8/2008 | Izadpanah |
| 7,412,224 B2 | 8/2008 | Kotola et al. |
| 7,424,228 B1 | 9/2008 | Williams et al. |
| 7,444,051 B2 | 10/2008 | Tatat et al. |
| 7,450,853 B2 | 11/2008 | Kim et al. |
| 7,450,854 B2 | 11/2008 | Lee et al. |
| 7,451,365 B2 | 11/2008 | Wang et al. |
| 7,454,222 B2 | 11/2008 | Huang et al. |
| 7,460,507 B2 | 12/2008 | Kubler et al. |
| 7,460,829 B2 | 12/2008 | Utsumi et al. |
| 7,460,831 B2 | 12/2008 | Hasarchi |
| 7,466,925 B2 | 12/2008 | Iannelli |
| 7,469,105 B2 | 12/2008 | Wake et al. |
| 7,477,597 B2 | 1/2009 | Segel |
| 7,483,504 B2 | 1/2009 | Shapira et al. |
| 7,483,711 B2 | 1/2009 | Burchfiel |
| 7,495,560 B2 | 2/2009 | Easton et al. |
| 7,496,070 B2 | 2/2009 | Vesuna |
| 7,496,384 B2 | 2/2009 | Seto et al. |
| 7,505,747 B2 | 3/2009 | Solum |
| 7,512,419 B2 | 3/2009 | Solum |
| 7,522,552 B2 | 4/2009 | Fein et al. |
| 7,539,509 B2 | 5/2009 | Bauman et al. |
| 7,542,452 B2 | 6/2009 | Penumetsa |
| 7,546,138 B2 | 6/2009 | Bauman |
| 7,548,138 B2 | 6/2009 | Kamgaing |
| 7,548,695 B2 | 6/2009 | Wake |
| 7,551,641 B2 | 6/2009 | Pirzada et al. |
| 7,557,758 B2 | 7/2009 | Rofougaran |
| 7,565,080 B2 | 7/2009 | Mickelsson et al. |
| 7,580,384 B2 | 8/2009 | Kubler et al. |
| 7,586,861 B2 | 9/2009 | Kubler et al. |
| 7,590,354 B2 | 9/2009 | Sauer et al. |
| 7,593,704 B2 | 9/2009 | Pinel et al. |
| 7,599,420 B2 | 10/2009 | Forenza et al. |
| 7,599,672 B2 | 10/2009 | Shoji et al. |
| 7,610,046 B2 | 10/2009 | Wala |
| 7,630,690 B2 | 12/2009 | Kaewell, Jr. et al. |
| 7,633,934 B2 | 12/2009 | Kubler et al. |
| 7,639,982 B2 | 12/2009 | Wala |
| 7,646,743 B2 | 1/2010 | Kubler et al. |
| 7,646,777 B2 | 1/2010 | Hicks, III et al. |
| 7,653,397 B2 | 1/2010 | Pernu et al. |
| 7,668,565 B2 | 2/2010 | Ylänen et al. |
| 7,672,591 B2 | 3/2010 | Soto et al. |
| 7,675,936 B2 | 3/2010 | Mizutani et al. |
| 7,688,811 B2 | 3/2010 | Kubler et al. |
| 7,693,486 B2 | 4/2010 | Kasslin et al. |
| 7,697,467 B2 | 4/2010 | Kubler et al. |
| 7,697,574 B2 | 4/2010 | Suematsu et al. |
| 7,715,375 B2 | 5/2010 | Kubler et al. |
| 7,720,510 B2 | 5/2010 | Pescod et al. |
| 7,751,374 B2 | 7/2010 | Donovan |
| 7,751,838 B2 | 7/2010 | Ramesh et al. |
| 7,760,703 B2 | 7/2010 | Kubler et al. |
| 7,761,093 B2 | 7/2010 | Sabat, Jr. et al. |
| 7,768,951 B2 | 8/2010 | Kubler et al. |
| 7,773,573 B2 | 8/2010 | Chung et al. |
| 7,778,603 B2 | 8/2010 | Palin et al. |
| 7,787,823 B2 | 8/2010 | George et al. |
| 7,805,073 B2 | 9/2010 | Sabat, Jr. et al. |
| 7,809,012 B2 | 10/2010 | Ruuska et al. |
| 7,812,766 B2 | 10/2010 | Leblanc et al. |
| 7,812,775 B2 | 10/2010 | Babakhani et al. |
| 7,817,969 B2 | 10/2010 | Castaneda et al. |
| 7,835,328 B2 | 11/2010 | Stephens et al. |
| 7,848,316 B2 | 12/2010 | Kubler et al. |
| 7,848,747 B2 | 12/2010 | Wala ........................ 455/424 |
| 7,848,770 B2 | 12/2010 | Scheinert |
| 7,853,234 B2 | 12/2010 | Afsahi |
| 7,870,321 B2 | 1/2011 | Rofougaran |
| 7,880,677 B2 | 2/2011 | Rofougaran et al. |
| 7,881,755 B1 | 2/2011 | Mishra et al. |
| 7,894,423 B2 | 2/2011 | Kubler et al. |
| 7,899,007 B2 | 3/2011 | Kubler et al. |
| 7,907,972 B2 | 3/2011 | Walton et al. |
| 7,912,043 B2 | 3/2011 | Kubler et al. |
| 7,912,506 B2 | 3/2011 | Lovberg et al. |
| 7,912,706 B2 | 3/2011 | Kubler et al. |
| 7,917,177 B2 | 3/2011 | Bauman |
| 7,920,553 B2 | 4/2011 | Kubler et al. |
| 7,920,858 B2 | 4/2011 | Sabat, Jr. et al. |
| 7,924,783 B1 | 4/2011 | Mahany et al. |
| 7,936,713 B2 | 5/2011 | Kubler et al. |
| 7,949,364 B2 | 5/2011 | Kasslin et al. |
| 7,957,777 B1 | 6/2011 | Vu et al. |
| 7,962,111 B2 | 6/2011 | Solum |
| 7,969,009 B2 | 6/2011 | Chandrasekaran |
| 7,969,911 B2 | 6/2011 | Mahany et al. |
| 7,990,925 B2 | 8/2011 | Tinnakornsrisuphap et al. |
| 7,996,020 B1 | 8/2011 | Chhabra |
| 8,018,907 B2 | 9/2011 | Kubler et al. |
| 8,023,886 B2 | 9/2011 | Rofougaran |
| 8,027,656 B2 | 9/2011 | Rofougaran et al. |
| 8,036,308 B2 | 10/2011 | Rofougaran |
| 8,073,329 B2 | 12/2011 | Gao et al. |
| 8,082,353 B2 | 12/2011 | Huber et al. |
| 8,086,192 B2 | 12/2011 | Rofougaran et al. |
| 8,107,815 B2 | 1/2012 | Akasaka et al. |
| 8,135,102 B2 | 3/2012 | Wiwel et al. |
| 8,213,401 B2 | 7/2012 | Fischer et al. |
| 8,223,795 B2 | 7/2012 | Cox et al. |
| 8,228,849 B2 | 7/2012 | Trachewsky |
| 8,238,463 B1 | 8/2012 | Arslan et al. |
| 8,270,387 B2 | 9/2012 | Cannon et al. |
| 8,275,262 B2 | 9/2012 | Cui et al. |
| 8,280,250 B2 | 10/2012 | Brodsky et al. |
| 8,280,259 B2 | 10/2012 | George et al. |
| 8,290,483 B2 | 10/2012 | Sabat, Jr. et al. |
| 8,306,563 B2 | 11/2012 | Zavadsky et al. |
| 8,346,278 B2 | 1/2013 | Wala et al. |
| 8,351,792 B2 | 1/2013 | Zheng |
| 8,374,508 B2 | 2/2013 | Soto et al. |
| 8,391,256 B2 | 3/2013 | Beach |
| 8,422,883 B2 | 4/2013 | Yeh et al. |

(56) References Cited

U.S. PATENT DOCUMENTS

| | | |
|---|---|---|
| 8,428,510 B2 | 4/2013 | Stratford et al. |
| 8,452,178 B2 | 5/2013 | Gao et al. |
| 8,462,683 B2 | 6/2013 | Uyehara et al. |
| 8,472,579 B2 | 6/2013 | Uyehara et al. |
| 8,488,966 B2 | 7/2013 | Zheng |
| 8,509,215 B2 | 8/2013 | Stuart |
| 8,509,850 B2 | 8/2013 | Zavadsky et al. |
| 8,526,970 B2 | 9/2013 | Wala et al. |
| 8,532,242 B2 | 9/2013 | Fischer et al. |
| 8,626,245 B2 | 1/2014 | Zavadsky et al. |
| 8,639,121 B2 | 1/2014 | George et al. |
| 8,649,684 B2 | 2/2014 | Casterline et al. |
| 8,676,214 B2 | 3/2014 | Fischer et al. |
| 8,737,454 B2 | 5/2014 | Wala et al. |
| 8,743,718 B2 | 6/2014 | Grenier et al. |
| 8,743,756 B2 | 6/2014 | Uyehara et al. |
| 8,837,659 B2 | 9/2014 | Uyehara et al. |
| 8,837,940 B2 | 9/2014 | Smith et al. |
| 8,873,585 B2 | 10/2014 | Oren et al. |
| 8,929,288 B2 | 1/2015 | Stewart et al. |
| 9,107,086 B2 | 8/2015 | Leimeister et al. |
| 9,112,547 B2 | 8/2015 | Scheinert et al. |
| 2001/0036163 A1 | 11/2001 | Sabat, Jr. et al. |
| 2001/0036199 A1 | 11/2001 | Terry |
| 2002/0003645 A1 | 1/2002 | Kim et al. |
| 2002/0009070 A1 | 1/2002 | Lindsay et al. |
| 2002/0012336 A1 | 1/2002 | Hughes et al. |
| 2002/0012495 A1 | 1/2002 | Sasai et al. |
| 2002/0016827 A1 | 2/2002 | McCabe et al. |
| 2002/0045518 A1 | 4/2002 | Dalebout et al. |
| 2002/0045519 A1 | 4/2002 | Watterson et al. |
| 2002/0048071 A1 | 4/2002 | Suzuki et al. |
| 2002/0051434 A1 | 5/2002 | Ozluturk et al. |
| 2002/0075906 A1 | 6/2002 | Cole et al. |
| 2002/0092347 A1 | 7/2002 | Niekerk et al. |
| 2002/0097564 A1 | 7/2002 | Struhsaker et al. |
| 2002/0103012 A1 | 8/2002 | Kim et al. |
| 2002/0111149 A1 | 8/2002 | Shoki |
| 2002/0111192 A1 | 8/2002 | Thomas et al. |
| 2002/0114038 A1 | 8/2002 | Arnon et al. |
| 2002/0123365 A1 | 9/2002 | Thorson et al. |
| 2002/0126967 A1 | 9/2002 | Panak et al. |
| 2002/0128009 A1 | 9/2002 | Boch et al. |
| 2002/0130778 A1 | 9/2002 | Nicholson |
| 2002/0181668 A1 | 12/2002 | Masoian et al. |
| 2002/0190845 A1 | 12/2002 | Moore |
| 2002/0197984 A1 | 12/2002 | Monin et al. |
| 2003/0002604 A1 | 1/2003 | Fifield et al. |
| 2003/0007214 A1 | 1/2003 | Aburakawa et al. |
| 2003/0016418 A1 | 1/2003 | Westbrook et al. |
| 2003/0045284 A1 | 3/2003 | Copley et al. |
| 2003/0069922 A1 | 4/2003 | Arunachalam |
| 2003/0078074 A1 | 4/2003 | Sesay et al. |
| 2003/0112826 A1 | 6/2003 | Ashwood Smith et al. |
| 2003/0126294 A1 | 7/2003 | Thorsteinson et al. |
| 2003/0141962 A1 | 7/2003 | Barink |
| 2003/0161637 A1 | 8/2003 | Yamamoto et al. |
| 2003/0165287 A1 | 9/2003 | Krill et al. |
| 2003/0174099 A1 | 9/2003 | Bauer et al. |
| 2003/0209601 A1 | 11/2003 | Chung |
| 2004/0001719 A1 | 1/2004 | Sasaki |
| 2004/0008114 A1 | 1/2004 | Sawyer |
| 2004/0008136 A1* | 1/2004 | Reyneri ............... H03M 1/123 341/155 |
| 2004/0017785 A1 | 1/2004 | Zelst |
| 2004/0037565 A1 | 2/2004 | Young et al. |
| 2004/0041714 A1 | 3/2004 | Forster |
| 2004/0043764 A1 | 3/2004 | Bigham et al. |
| 2004/0047313 A1 | 3/2004 | Rumpf et al. |
| 2004/0078151 A1 | 4/2004 | Aljadeff et al. |
| 2004/0095907 A1 | 5/2004 | Agee et al. |
| 2004/0100930 A1 | 5/2004 | Shapira et al. |
| 2004/0106435 A1 | 6/2004 | Bauman et al. |
| 2004/0126068 A1 | 7/2004 | Van Bijsterveld |
| 2004/0126107 A1 | 7/2004 | Jay et al. |
| 2004/0139477 A1 | 7/2004 | Russell et al. |
| 2004/0146020 A1 | 7/2004 | Kubler et al. |
| 2004/0149736 A1 | 8/2004 | Clothier |
| 2004/0151164 A1 | 8/2004 | Kubler et al. |
| 2004/0151503 A1 | 8/2004 | Kashima et al. |
| 2004/0157623 A1 | 8/2004 | Splett |
| 2004/0160912 A1 | 8/2004 | Kubler et al. |
| 2004/0160913 A1 | 8/2004 | Kubler et al. |
| 2004/0162084 A1 | 8/2004 | Wang |
| 2004/0162115 A1 | 8/2004 | Smith et al. |
| 2004/0162116 A1 | 8/2004 | Han et al. |
| 2004/0165573 A1 | 8/2004 | Kubler et al. |
| 2004/0175173 A1 | 9/2004 | Deas |
| 2004/0196404 A1 | 10/2004 | Loheit et al. |
| 2004/0202257 A1 | 10/2004 | Mehta et al. |
| 2004/0203703 A1 | 10/2004 | Fischer |
| 2004/0203704 A1 | 10/2004 | Ommodt et al. |
| 2004/0203846 A1 | 10/2004 | Caronni et al. |
| 2004/0204109 A1 | 10/2004 | Hoppenstein |
| 2004/0208526 A1 | 10/2004 | Mibu |
| 2004/0208643 A1 | 10/2004 | Roberts et al. |
| 2004/0215723 A1 | 10/2004 | Chadha |
| 2004/0218873 A1 | 11/2004 | Nagashima et al. |
| 2004/0233877 A1 | 11/2004 | Lee et al. |
| 2004/0258105 A1 | 12/2004 | Spathas et al. |
| 2004/0267971 A1 | 12/2004 | Seshadri |
| 2005/0052287 A1 | 3/2005 | Whitesmith et al. |
| 2005/0058451 A1 | 3/2005 | Ross |
| 2005/0058455 A1 | 3/2005 | Aronson et al. |
| 2005/0068179 A1 | 3/2005 | Roesner |
| 2005/0076982 A1 | 4/2005 | Metcalf et al. |
| 2005/0078006 A1 | 4/2005 | Hutchins |
| 2005/0093679 A1 | 5/2005 | Zai et al. |
| 2005/0099343 A1 | 5/2005 | Asrani et al. |
| 2005/0116821 A1 | 6/2005 | Wilsey et al. |
| 2005/0123232 A1 | 6/2005 | Piede et al. |
| 2005/0141545 A1 | 6/2005 | Fein et al. |
| 2005/0143077 A1 | 6/2005 | Charbonneau |
| 2005/0147067 A1 | 7/2005 | Mani et al. |
| 2005/0147071 A1 | 7/2005 | Karaoguz et al. |
| 2005/0148306 A1 | 7/2005 | Hiddink |
| 2005/0159108 A1 | 7/2005 | Fletcher |
| 2005/0174236 A1 | 8/2005 | Brookner |
| 2005/0176458 A1 | 8/2005 | Shklarsky et al. |
| 2005/0180314 A1* | 8/2005 | Webster ............... H04L 5/023 370/208 |
| 2005/0201323 A1 | 9/2005 | Mani et al. |
| 2005/0201761 A1 | 9/2005 | Bartur et al. |
| 2005/0219050 A1 | 10/2005 | Martin |
| 2005/0224585 A1 | 10/2005 | Durrant et al. |
| 2005/0226625 A1 | 10/2005 | Wake et al. |
| 2005/0232636 A1 | 10/2005 | Durrant et al. |
| 2005/0242188 A1 | 11/2005 | Vesuna |
| 2005/0252971 A1 | 11/2005 | Howarth et al. |
| 2005/0266797 A1 | 12/2005 | Utsumi et al. |
| 2005/0266854 A1 | 12/2005 | Niiho et al. |
| 2005/0269930 A1 | 12/2005 | Shimizu et al. |
| 2005/0271396 A1 | 12/2005 | Iannelli |
| 2005/0272439 A1 | 12/2005 | Picciriello et al. |
| 2006/0002326 A1 | 1/2006 | Vesuna |
| 2006/0014548 A1 | 1/2006 | Bolin |
| 2006/0017633 A1 | 1/2006 | Pronkine |
| 2006/0028352 A1 | 2/2006 | McNamara et al. |
| 2006/0045054 A1 | 3/2006 | Utsumi et al. |
| 2006/0045524 A1 | 3/2006 | Lee et al. |
| 2006/0045525 A1 | 3/2006 | Lee et al. |
| 2006/0053324 A1 | 3/2006 | Giat et al. |
| 2006/0056327 A1 | 3/2006 | Coersmeier |
| 2006/0062579 A1 | 3/2006 | Kim et al. |
| 2006/0083512 A1 | 4/2006 | Wake |
| 2006/0083520 A1 | 4/2006 | Healey et al. |
| 2006/0094470 A1 | 5/2006 | Wake et al. |
| 2006/0104643 A1 | 5/2006 | Lee et al. |
| 2006/0159388 A1 | 7/2006 | Kawase et al. |
| 2006/0172775 A1 | 8/2006 | Conyers et al. |
| 2006/0182446 A1 | 8/2006 | Kim et al. |
| 2006/0182449 A1 | 8/2006 | Iannelli et al. |
| 2006/0189354 A1 | 8/2006 | Lee et al. |
| 2006/0209745 A1 | 9/2006 | MacMullan et al. |

(56) References Cited

U.S. PATENT DOCUMENTS

| | | |
|---|---|---|
| 2006/0223439 A1 | 10/2006 | Pinel et al. |
| 2006/0233506 A1 | 10/2006 | Noonan et al. |
| 2006/0239630 A1 | 10/2006 | Hase et al. |
| 2006/0268738 A1 | 11/2006 | Goerke et al. |
| 2006/0274704 A1 | 12/2006 | Desai et al. |
| 2007/0009266 A1 | 1/2007 | Bothwell |
| 2007/0030185 A1* | 2/2007 | Bandy .................. H03M 9/00 341/101 |
| 2007/0050451 A1 | 3/2007 | Caspi et al. |
| 2007/0054682 A1 | 3/2007 | Fanning et al. |
| 2007/0058978 A1 | 3/2007 | Lee et al. |
| 2007/0060045 A1 | 3/2007 | Prautzsch |
| 2007/0060055 A1 | 3/2007 | Desai et al. |
| 2007/0061342 A1* | 3/2007 | Magdeburger ........ G06F 13/385 |
| 2007/0071128 A1 | 3/2007 | Meir et al. |
| 2007/0076649 A1 | 4/2007 | Lin et al. |
| 2007/0093273 A1 | 4/2007 | Cai |
| 2007/0149250 A1 | 6/2007 | Crozzoli et al. |
| 2007/0166042 A1 | 7/2007 | Seeds et al. |
| 2007/0173288 A1 | 7/2007 | Skarby et al. |
| 2007/0174889 A1 | 7/2007 | Kim et al. |
| 2007/0224954 A1 | 9/2007 | Gopi |
| 2007/0230328 A1 | 10/2007 | Saitou |
| 2007/0243899 A1 | 10/2007 | Hermel et al. |
| 2007/0248358 A1 | 10/2007 | Sauer |
| 2007/0253714 A1 | 11/2007 | Seeds et al. |
| 2007/0257796 A1 | 11/2007 | Easton et al. |
| 2007/0264009 A1 | 11/2007 | Sabat, Jr. et al. |
| 2007/0264011 A1 | 11/2007 | Sone et al. |
| 2007/0268846 A1 | 11/2007 | Proctor et al. |
| 2007/0274279 A1 | 11/2007 | Wood et al. |
| 2007/0286599 A1 | 12/2007 | Sauer et al. |
| 2007/0292143 A1 | 12/2007 | Yu et al. |
| 2007/0297005 A1 | 12/2007 | Montierth et al. |
| 2008/0002652 A1 | 1/2008 | Gupta et al. |
| 2008/0007453 A1 | 1/2008 | Vassilakis et al. |
| 2008/0013909 A1 | 1/2008 | Kostet et al. |
| 2008/0013956 A1 | 1/2008 | Ware et al. |
| 2008/0013957 A1 | 1/2008 | Akers et al. |
| 2008/0014948 A1 | 1/2008 | Scheinert |
| 2008/0026765 A1 | 1/2008 | Charbonneau |
| 2008/0031628 A1 | 2/2008 | Dragas et al. |
| 2008/0043714 A1 | 2/2008 | Pernu |
| 2008/0056167 A1 | 3/2008 | Kim et al. |
| 2008/0058018 A1 | 3/2008 | Scheinert |
| 2008/0063397 A1 | 3/2008 | Hu et al. |
| 2008/0070502 A1 | 3/2008 | George et al. |
| 2008/0080863 A1 | 4/2008 | Sauer et al. |
| 2008/0098203 A1 | 4/2008 | Master et al. |
| 2008/0118014 A1 | 5/2008 | Reunamaki et al. |
| 2008/0119198 A1 | 5/2008 | Hettstedt et al. |
| 2008/0124086 A1 | 5/2008 | Matthews |
| 2008/0124087 A1 | 5/2008 | Hartmann et al. |
| 2008/0129634 A1 | 6/2008 | Pera et al. |
| 2008/0134194 A1 | 6/2008 | Liu |
| 2008/0145061 A1 | 6/2008 | Lee et al. |
| 2008/0150514 A1 | 6/2008 | Codreanu et al. |
| 2008/0159744 A1 | 7/2008 | Soto et al. |
| 2008/0166094 A1 | 7/2008 | Bookbinder et al. |
| 2008/0191682 A1 | 8/2008 | Cook |
| 2008/0194226 A1 | 8/2008 | Rivas et al. |
| 2008/0207253 A1 | 8/2008 | Jaakkola et al. |
| 2008/0212969 A1 | 9/2008 | Fasshauer et al. |
| 2008/0219670 A1 | 9/2008 | Kim et al. |
| 2008/0232305 A1 | 9/2008 | Oren et al. |
| 2008/0232799 A1 | 9/2008 | Kim |
| 2008/0247716 A1 | 10/2008 | Thomas |
| 2008/0253280 A1 | 10/2008 | Tang et al. |
| 2008/0253351 A1 | 10/2008 | Pernu et al. |
| 2008/0253773 A1 | 10/2008 | Zheng |
| 2008/0260388 A1 | 10/2008 | Kim et al. |
| 2008/0260389 A1 | 10/2008 | Zheng |
| 2008/0261656 A1 | 10/2008 | Bella et al. |
| 2008/0268766 A1 | 10/2008 | Narkmon et al. |
| 2008/0268833 A1 | 10/2008 | Huang et al. |
| 2008/0273844 A1 | 11/2008 | Kewitsch |
| 2008/0279137 A1 | 11/2008 | Pernu et al. |
| 2008/0280569 A1 | 11/2008 | Hazani et al. |
| 2008/0291830 A1 | 11/2008 | Pernu et al. |
| 2008/0292322 A1 | 11/2008 | Daghighian et al. |
| 2008/0298813 A1 | 12/2008 | Song et al. |
| 2008/0304831 A1 | 12/2008 | Miller, II et al. |
| 2008/0310464 A1 | 12/2008 | Schneider |
| 2008/0310848 A1 | 12/2008 | Yasuda et al. |
| 2008/0311876 A1 | 12/2008 | Leenaerts et al. |
| 2008/0311944 A1 | 12/2008 | Hansen et al. |
| 2009/0022304 A1 | 1/2009 | Kubler et al. |
| 2009/0028087 A1 | 1/2009 | Nguyen et al. |
| 2009/0028317 A1 | 1/2009 | Ling et al. |
| 2009/0041413 A1 | 2/2009 | Hurley |
| 2009/0047023 A1 | 2/2009 | Pescod et al. |
| 2009/0059903 A1 | 3/2009 | Kubler et al. |
| 2009/0061796 A1 | 3/2009 | Arkko et al. |
| 2009/0061939 A1 | 3/2009 | Andersson et al. |
| 2009/0073916 A1 | 3/2009 | Zhang et al. |
| 2009/0081985 A1 | 3/2009 | Rofougaran et al. |
| 2009/0087179 A1 | 4/2009 | Underwood et al. |
| 2009/0088071 A1 | 4/2009 | Rofougaran |
| 2009/0088072 A1 | 4/2009 | Rofougaran et al. |
| 2009/0135078 A1 | 5/2009 | Lindmark et al. |
| 2009/0141780 A1 | 6/2009 | Cruz-Albrecht et al. |
| 2009/0149221 A1 | 6/2009 | Liu et al. |
| 2009/0154621 A1 | 6/2009 | Shapira et al. |
| 2009/0169163 A1 | 7/2009 | Abbott, III et al. |
| 2009/0175214 A1 | 7/2009 | Sfar et al. |
| 2009/0180407 A1 | 7/2009 | Sabat et al. |
| 2009/0180426 A1 | 7/2009 | Sabat et al. |
| 2009/0218407 A1 | 9/2009 | Rofougaran |
| 2009/0218657 A1 | 9/2009 | Rofougaran |
| 2009/0237317 A1 | 9/2009 | Rofougaran |
| 2009/0245084 A1 | 10/2009 | Moffatt et al. |
| 2009/0245153 A1 | 10/2009 | Li et al. |
| 2009/0245221 A1 | 10/2009 | Piipponen |
| 2009/0247109 A1 | 10/2009 | Rofougaran |
| 2009/0252136 A1 | 10/2009 | Mahany et al. |
| 2009/0252139 A1 | 10/2009 | Ludovico et al. |
| 2009/0252205 A1 | 10/2009 | Rheinfelder et al. |
| 2009/0258652 A1 | 10/2009 | Lambert et al. |
| 2009/0278596 A1 | 11/2009 | Rofougaran et al. |
| 2009/0279593 A1 | 11/2009 | Rofougaran et al. |
| 2009/0285147 A1 | 11/2009 | Subasic et al. |
| 2009/0316608 A1 | 12/2009 | Singh et al. |
| 2009/0319909 A1 | 12/2009 | Hsueh et al. |
| 2010/0002626 A1 | 1/2010 | Schmidt et al. |
| 2010/0002661 A1 | 1/2010 | Schmidt et al. |
| 2010/0002662 A1 | 1/2010 | Schmidt et al. |
| 2010/0014494 A1 | 1/2010 | Schmidt et al. |
| 2010/0014868 A1 | 1/2010 | McGlynn et al. |
| 2010/0027443 A1 | 2/2010 | LoGalbo et al. |
| 2010/0056200 A1 | 3/2010 | Tolonen |
| 2010/0080154 A1 | 4/2010 | Noh et al. |
| 2010/0080182 A1 | 4/2010 | Kubler et al. |
| 2010/0091475 A1 | 4/2010 | Toms et al. |
| 2010/0118864 A1 | 5/2010 | Kubler et al. |
| 2010/0120386 A1* | 5/2010 | Konstantinos ......... H03H 17/06 455/180.1 |
| 2010/0127937 A1 | 5/2010 | Chandrasekaran et al. |
| 2010/0134257 A1 | 6/2010 | Puleston et al. |
| 2010/0142598 A1 | 6/2010 | Murray et al. |
| 2010/0142955 A1 | 6/2010 | Yu et al. |
| 2010/0144285 A1 | 6/2010 | Behzad et al. |
| 2010/0148373 A1 | 6/2010 | Chandrasekaran |
| 2010/0150556 A1 | 6/2010 | Soto et al. |
| 2010/0156685 A1* | 6/2010 | Westwick ............. H03M 1/002 341/135 |
| 2010/0156721 A1 | 6/2010 | Alamouti et al. |
| 2010/0158525 A1 | 6/2010 | Walter |
| 2010/0159859 A1 | 6/2010 | Rofougaran |
| 2010/0188998 A1 | 7/2010 | Pernu et al. |
| 2010/0189439 A1 | 7/2010 | Novak et al. |
| 2010/0190509 A1 | 7/2010 | Davis |
| 2010/0202326 A1 | 8/2010 | Rofougaran et al. |
| 2010/0225413 A1 | 9/2010 | Rofougaran et al. |
| 2010/0225520 A1 | 9/2010 | Mohamadi et al. |

(56) References Cited

U.S. PATENT DOCUMENTS

| | | |
|---|---|---|
| 2010/0225556 A1 | 9/2010 | Rofougaran et al. |
| 2010/0225557 A1 | 9/2010 | Rofougaran et al. |
| 2010/0232323 A1 | 9/2010 | Kubler et al. |
| 2010/0246558 A1 | 9/2010 | Harel |
| 2010/0255774 A1 | 10/2010 | Kenington |
| 2010/0258949 A1 | 10/2010 | Henderson et al. |
| 2010/0260063 A1 | 10/2010 | Kubler et al. |
| 2010/0261501 A1 | 10/2010 | Behzad et al. |
| 2010/0266287 A1 | 10/2010 | Adhikari et al. |
| 2010/0278530 A1 | 11/2010 | Kummetz et al. |
| 2010/0284323 A1 | 11/2010 | Tang et al. |
| 2010/0290355 A1 | 11/2010 | Roy et al. |
| 2010/0309049 A1 | 12/2010 | Reunamäki et al. |
| 2010/0309752 A1 | 12/2010 | Lee et al. |
| 2010/0311472 A1 | 12/2010 | Rofougaran et al. |
| 2010/0311480 A1 | 12/2010 | Raines et al. |
| 2010/0329161 A1 | 12/2010 | Ylanen et al. |
| 2010/0329166 A1 | 12/2010 | Mahany et al. |
| 2010/0329680 A1 | 12/2010 | Presi et al. |
| 2011/0002687 A1 | 1/2011 | Sabat, Jr. et al. |
| 2011/0007724 A1 | 1/2011 | Mahany et al. |
| 2011/0007733 A1 | 1/2011 | Kubler et al. |
| 2011/0008042 A1 | 1/2011 | Stewart |
| 2011/0019999 A1 | 1/2011 | George et al. |
| 2011/0021146 A1 | 1/2011 | Pernu |
| 2011/0021224 A1 | 1/2011 | Koskinen et al. |
| 2011/0026932 A1 | 2/2011 | Yeh et al. |
| 2011/0045767 A1 | 2/2011 | Rofougaran et al. |
| 2011/0055875 A1 | 3/2011 | Zussman |
| 2011/0065450 A1 | 3/2011 | Kazmi |
| 2011/0066774 A1 | 3/2011 | Rofougaran |
| 2011/0069668 A1 | 3/2011 | Chion et al. |
| 2011/0071734 A1 | 3/2011 | Van Wiemeersch et al. |
| 2011/0086614 A1 | 4/2011 | Brisebois et al. |
| 2011/0116393 A1 | 5/2011 | Hong et al. |
| 2011/0116572 A1 | 5/2011 | Lee et al. |
| 2011/0116794 A1 | 5/2011 | George et al. |
| 2011/0122912 A1 | 5/2011 | Benjamin et al. |
| 2011/0126071 A1 | 5/2011 | Han et al. |
| 2011/0149879 A1 | 6/2011 | Noriega et al. |
| 2011/0158298 A1 | 6/2011 | Djadi et al. |
| 2011/0182230 A1 | 7/2011 | Ohm et al. |
| 2011/0194475 A1 | 8/2011 | Kim et al. |
| 2011/0200328 A1 | 8/2011 | In De Betou et al. |
| 2011/0201368 A1 | 8/2011 | Faccin et al. |
| 2011/0204504 A1 | 8/2011 | Henderson et al. |
| 2011/0206383 A1 | 8/2011 | Chien et al. |
| 2011/0211439 A1 | 9/2011 | Manpuria et al. |
| 2011/0215901 A1 | 9/2011 | Van Wiemeersch et al. |
| 2011/0222415 A1 | 9/2011 | Ramamurthi et al. |
| 2011/0222434 A1 | 9/2011 | Chen |
| 2011/0222619 A1 | 9/2011 | Ramamurthi et al. |
| 2011/0227795 A1 | 9/2011 | Lopez et al. |
| 2011/0244887 A1 | 10/2011 | Dupray et al. |
| 2011/0256878 A1 | 10/2011 | Zhu et al. |
| 2011/0268033 A1 | 11/2011 | Boldi et al. |
| 2011/0268449 A1 | 11/2011 | Berlin et al. |
| 2011/0274021 A1 | 11/2011 | He et al. |
| 2011/0281536 A1 | 11/2011 | Lee et al. |
| 2011/0312340 A1 | 12/2011 | Wu et al. |
| 2012/0069880 A1 | 3/2012 | Lemson et al. |
| 2012/0177026 A1 | 7/2012 | Uyehara et al. |
| 2012/0257893 A1 | 10/2012 | Boyd et al. |
| 2012/0281565 A1 | 11/2012 | Sauer |
| 2012/0309337 A1* | 12/2012 | Zhu .............. H04L 7/0334 455/341 |
| 2012/0321305 A1 | 12/2012 | George et al. |
| 2013/0003714 A1* | 1/2013 | Cannon ............ H04L 27/0002 370/345 |
| 2013/0012195 A1 | 1/2013 | Sabat, Jr. et al. |
| 2013/0089332 A1 | 4/2013 | Sauer et al. |
| 2013/0195467 A1 | 8/2013 | Schmid et al. |
| 2013/0210490 A1 | 8/2013 | Fischer et al. |
| 2014/0016583 A1 | 1/2014 | Smith |
| 2014/0072064 A1 | 3/2014 | Lemson et al. |
| 2014/0118464 A1 | 5/2014 | George et al. |
| 2014/0119735 A1 | 5/2014 | Cune et al. |
| 2014/0140225 A1 | 5/2014 | Wala |
| 2014/0146797 A1 | 5/2014 | Zavadsky et al. |
| 2014/0146861 A1 | 5/2014 | Li et al. |
| 2014/0146905 A1 | 5/2014 | Zavadsky et al. |
| 2014/0146906 A1 | 5/2014 | Zavadsky et al. |
| 2014/0219140 A1 | 8/2014 | Uyehara et al. |
| 2014/0248050 A1* | 9/2014 | Crilly, Jr. ......... H04B 10/25758 398/38 |
| 2015/0037041 A1 | 2/2015 | Cune et al. |
| 2015/0055720 A1* | 2/2015 | Lin ................ H04L 27/0002 375/259 |
| 2015/0056941 A1* | 2/2015 | Lin .................. H04B 1/18 455/352 |

FOREIGN PATENT DOCUMENTS

| | | |
|---|---|---|
| CA | 2065090 C | 2/1998 |
| CA | 2242707 A1 | 1/1999 |
| CN | 1207841 A | 2/1999 |
| CN | 101043276 A | 9/2007 |
| CN | 101389148 A | 3/2009 |
| CN | 101547447 A | 9/2009 |
| DE | 20104862 U1 | 8/2001 |
| DE | 10249414 A1 | 5/2004 |
| EP | 0477952 A2 | 4/1992 |
| EP | 0477952 A3 | 4/1992 |
| EP | 0461583 B1 | 3/1997 |
| EP | 851618 A2 | 7/1998 |
| EP | 0687400 B1 | 11/1998 |
| EP | 0899976 A2 | 3/1999 |
| EP | 0993124 A2 | 4/2000 |
| EP | 0994582 A1 | 4/2000 |
| EP | 1037411 A2 | 9/2000 |
| EP | 1089586 A2 | 4/2001 |
| EP | 1179895 A1 | 2/2002 |
| EP | 1267447 A1 | 12/2002 |
| EP | 1347584 A2 | 9/2003 |
| EP | 1363352 A1 | 11/2003 |
| EP | 1391897 A1 | 2/2004 |
| EP | 1443687 A1 | 8/2004 |
| EP | 1455550 A2 | 9/2004 |
| EP | 1501206 A1 | 1/2005 |
| EP | 1503451 A1 | 2/2005 |
| EP | 1530316 A1 | 5/2005 |
| EP | 1511203 B1 | 3/2006 |
| EP | 1267447 B1 | 8/2006 |
| EP | 1693974 A1 | 8/2006 |
| EP | 1742388 A1 | 1/2007 |
| EP | 1227605 B1 | 1/2008 |
| EP | 1916806 A1 | 4/2008 |
| EP | 1954019 A1 | 8/2008 |
| EP | 1968250 A1 | 9/2008 |
| EP | 1056226 B1 | 4/2009 |
| EP | 1357683 B1 | 5/2009 |
| EP | 2276298 A1 | 1/2011 |
| EP | 1570626 B1 | 11/2013 |
| GB | 2319439 A | 5/1998 |
| GB | 2323252 A | 9/1998 |
| GB | 2370170 A | 6/2002 |
| GB | 2399963 A | 9/2004 |
| GB | 2428149 A | 1/2007 |
| JP | H4189036 A | 7/1992 |
| JP | 0526018 A | 10/1993 |
| JP | 09083450 A | 3/1997 |
| JP | 09162810 A | 6/1997 |
| JP | 09200840 A | 7/1997 |
| JP | 11068675 A | 3/1999 |
| JP | 2000152300 A | 5/2000 |
| JP | 2000341744 A | 12/2000 |
| JP | 2002264617 A | 9/2002 |
| JP | 2002353813 A | 12/2002 |
| JP | 2003148653 A | 5/2003 |
| JP | 2003172827 A | 6/2003 |
| JP | 2004172734 A | 6/2004 |
| JP | 2004222297 A | 8/2004 |
| JP | 2004245963 A | 9/2004 |
| JP | 2004247090 A | 9/2004 |

(56) References Cited

FOREIGN PATENT DOCUMENTS

| | | |
|---|---|---|
| JP | 2004264901 A | 9/2004 |
| JP | 2004265624 A | 9/2004 |
| JP | 2004317737 A | 11/2004 |
| JP | 2004349184 A | 12/2004 |
| JP | 2005018175 A | 1/2005 |
| JP | 2005087135 A | 4/2005 |
| JP | 2005134125 A | 5/2005 |
| JP | 2007228603 A | 9/2007 |
| JP | 2008172597 A | 7/2008 |
| JP | 2010141386 A | 6/2010 |
| KR | 20010055088 A | 7/2001 |
| WO | 9603823 A1 | 2/1996 |
| WO | 9810600 A1 | 3/1998 |
| WO | 0042721 A1 | 7/2000 |
| WO | 0072475 A1 | 11/2000 |
| WO | 0178434 A1 | 10/2001 |
| WO | 0184760 A1 | 11/2001 |
| WO | 0209363 A2 | 1/2002 |
| WO | 0221183 A1 | 3/2002 |
| WO | 0230141 A1 | 4/2002 |
| WO | 02102102 A1 | 12/2002 |
| WO | 03024027 A1 | 3/2003 |
| WO | 03098175 A1 | 11/2003 |
| WO | 2004030154 A2 | 4/2004 |
| WO | 2004034098 A2 | 4/2004 |
| WO | 2004047472 A1 | 6/2004 |
| WO | 2004056019 A1 | 7/2004 |
| WO | 2004059934 A1 | 7/2004 |
| WO | 2004086795 A2 | 10/2004 |
| WO | 2004093471 A2 | 10/2004 |
| WO | 2005062505 A1 | 7/2005 |
| WO | 2005069203 A2 | 7/2005 |
| WO | 2005073897 A1 | 8/2005 |
| WO | 2005079386 A2 | 9/2005 |
| WO | 2005101701 A2 | 10/2005 |
| WO | 2005111959 A2 | 11/2005 |
| WO | 2006011778 A1 | 2/2006 |
| WO | 2006018592 A1 | 2/2006 |
| WO | 2006019392 A1 | 2/2006 |
| WO | 2006039941 A1 | 4/2006 |
| WO | 2006051262 A1 | 5/2006 |
| WO | 2006060754 A2 | 6/2006 |
| WO | 2006077569 A1 | 7/2006 |
| WO | 2006105185 A2 | 10/2006 |
| WO | 2006133609 A1 | 12/2006 |
| WO | 2006136811 A1 | 12/2006 |
| WO | 2007048427 A1 | 5/2007 |
| WO | 2007077451 A1 | 7/2007 |
| WO | 2007088561 A1 | 8/2007 |
| WO | 2007091026 A1 | 8/2007 |
| WO | 2007133507 A2 | 11/2007 |
| WO | 2008008249 A2 | 1/2008 |
| WO | 2008027213 A2 | 3/2008 |
| WO | 2008033298 A2 | 3/2008 |
| WO | 2008039830 A2 | 4/2008 |
| WO | 2008116014 A2 | 9/2008 |
| WO | 2006046088 A1 | 5/2009 |
| WO | 2009132824 A2 | 11/2009 |
| WO | 2010090999 A1 | 8/2010 |
| WO | 2010132739 A1 | 11/2010 |
| WO | 2011023592 A1 | 3/2011 |
| WO | 2011059705 A1 | 5/2011 |
| WO | 2011100095 A1 | 8/2011 |
| WO | 2011124717 A1 | 10/2011 |
| WO | 2011139939 A1 | 11/2011 |
| WO | 2011139942 A1 | 11/2011 |
| WO | 2012148938 A1 | 11/2012 |
| WO | 2012148940 A1 | 11/2012 |
| WO | 2013122915 A1 | 8/2013 |
| WO | WO2014/014974 A1 | 1/2014 |

OTHER PUBLICATIONS

Bo Zhang et al., "Reconfigurable Multifunctional Operation Using Optical Injection-Locked Vertical-Cavity Surface-Emitting Lasers," Journal of Lightwave Technology, vol. 27, No. 15, Aug. 2009, 6 pages.

Chang-Hasnain, et al., "Ultrahigh-speed laser modulation by injection locking," Chapter 6, Optical Fiber Telecommunication V A: Components and Subsystems, Elsevier Inc., 2008, 20 pages.

Cheng Zhang et al., "60 GHz Millimeter-wave Generation by Two-mode Injection-locked Fabry-Perot Laser Using Second-Order Sideband Injection in Radio-over-Fiber System," Conference on Lasers and Electro-Optics and Duantum Electronics, Optical Society of America, May 2008, 2 pages.

Chrostowski, "Optical Injection Locking of Vertical Cavity Surface Emitting Lasers," Fall 2003, PhD dissertation University of California at Berkely, 122 pages.

Dang et al., "Radio-over-Fiber based architecture for seamless wireless indoor communication in the 60GHz band," Computer Communications, Elsevier B.V., Amsterdam, NL, vol. 30, Sep. 8, 2007, pp. 3598-3613.

Hyuk-Kee Sung et al., "Optical Single Sideband Modulation Using Strong Optical Injection-Locked Semiconductor Lasers," IEEE Photonics Technology Letters, vol. 19, No. 13, Jul. 1, 2007, 4 pages.

Lim et al., "Analysis of Optical Carrier-to-Sideband Ratio for Improving Transmission Performance in Fiber-Radio Links," IEEE Transactions of Microwave Theory and Techniques, vol. 54, No. 5, May 2006, 7 pages.

Lu H H et al., "Improvement of radio-on-multimode fiber systems based on light injection and optoelectronic feedback techniques," Optics Communications, vol. 266, No. 2, Elsevier B.V., Oct. 15, 2006, 4 pages.

Pleros et al., "A 60 GHz Radio-Over-Fiber Network Architecture for Seamless Communication With High Mobility," Journal of Lightwave Technology, vol. 27, No. 12, IEEE, Jun. 15, 2009, pp. 1957-1967.

Reza et al., "Degree-of-Polarization-Based PMD Monitoring for Subcarrier-Multiplexed Signals Via Equalized Carrier/Sideband Filtering," Journal of Lightwave Technology, vol. 22, No. 4, IEEE, Apr. 2004, 8 pages.

Zhao, "Optical Injection Locking on Vertical-Cavity Surface-Emitting Lasers (VCSELs): Physics and Applications," Fall 2008, PhD dissertation University of California at Berkeley, pp. 1-209.

Author Unknown, "VCSEL Chaotic Synchronization and Modulation Characteristics," Master's Thesis, Southwest Jiatong University, Professor Pan Wei, Apr. 2006, 8 pages (machine translation).

Chowdhury et al., "Multi-service Multi-carrier Broadband MIMO Distributed Antenna Systems for In-building Optical Nireless Access," Presented at the 2010 Conference on Optical Fiber Communication and National Fiber Optic Engineers Conference, Mar. 21-25, 2010, San Diego, California, IEEE, pp. 1-3.

Biton et al., "Challenge: CeTV and Ca-Fi—Cellular and Wi-Fi over CATV," Proceedings of the Eleventh Annual International Conference on Mobile Computing and Networking, Aug. 28-Sep. 2, 2005, Cologne, Germany, Association for Computing Machinery, 8 pages.

Seto et al., "Optical Subcarrier Multiplexing Transmission for Base Station With Adaptive Array Antenna," IEEE Transactions on Microwave Theory and Techniques, vol. 49, No. 10, Oct. 2001, pp. 2036-2041.

Toycan, M. et al., "Optical network architecture for UWB range extension beyond a single complex of cells," Presented at the 33rd European Conference and Exhibition of Optical Communication, Sep. 16-20, 2007, Berlin, Germany, VDE, 2 pages.

Author Unknown, "The I2C-Bus Specification," Version 2.1, Jan. 2000, Philips Semiconductors, 46 pages.

Author Unknown, "ADC124S021 4-Channel, 50 ksps to 200 ksps, 12-Bit A/D Converter," Texas Instruments, Mar. 2005, Revised Mar. 2013, 27 pages.

Arredondo, Albedo et al., "Techniques for Improving In-Building Radio Coverage Using Fiber-Fed Distributed Antenna Networks," IEEE 46th Vehicular Technology Conference, Atlanta, Georgia, Apr. 28-May 1, 1996, pp. 1540-1543, vol. 3.

Bakaul, M., et al., "Efficient Multiplexing Scheme for Wavelength-Interleaved DEWM Millimeter-Wave Fiber-Radio Systems," IEEE Photonics Technology Letters, Dec. 2005, vol. 17, No. 12, pp. 2718-2720.

(56) References Cited

OTHER PUBLICATIONS

Cho, Bong Youl et al. "The Forward Link Performance of a PCS System with an AGC," 4th CDMA International conference and Exhibition, "The Realization of IMT-2000," 1999, 10 pages.
Chu, Ta-Shing et al. "Fiber optic microcellular radio", IEEE Transactions on Vehicular Technology, Aug. 1991, pp. 599-606, vol. 40, Issue 3.
Cooper, A.J., "Fiber/Radio for the Provision of Cordless/Mobile Telephony Services in the Access Network," Electronics Letters, 1990, pp. 2054-2056, vol. 26.
Cutrer, David M. et al., "Dynamic Range Requirements for Optical Transmitters in Fiber-Fed Microcellular Networks," IEEE Photonics Technology Letters, May 1995, pp. 564-566, vol. 7, No. 5.
Dolmans, G. et al. "Performance study of an adaptive dual antenna handset for indoor communications", IEE Proceedings: Microwaves, Antennas and Propagation, Apr. 1999, pp. 138-144, vol. 146, Issue 2.
Ellinger, Frank et al., "A 5.2 GHz variable gain LNA MMIC for adaptive antenna combining", IEEE MTT-S International Microwave Symposium Digest, Anaheim, California, Jun. 13-19, 1999, pp. 501-504, vol. 2.
Fan, J.C. et al., "Dynamic range requirements for microcellular personal communication systems using analog fiber-optic links", IEEE Transactions on Microwave Theory and Techniques, Aug. 1997, pp. 1390-1397, vol. 45, Issue 8.
Gibson, B.C., et al., "Evanescent Field Analysis of Air-Silica Microstructure Waveguides," The 14th Annual Meeting of the IEEE Lasers and Electro-Optics Society, 1-7803-7104-4/01, Nov. 12-13, 2001, vol. 2, pp. 709-710.
Huang, C., et al., "A WLAN-Used Helical Antenna Fully Integrated with the PCMCIA Carrier," IEEE Transactions on Antennas and Propagation, Dec. 2005, vol. 53, No. 12, pp. 4164-4168.
Kojucharow, K., et al., "Millimeter-Wave Signal Properties Resulting from Electrooptical Upconversion," IEEE Transaction on Microwave Theory and Techniques, Oct. 2001, vol. 49, No. 10, pp. 1977-1985.
Monro, T.M., et al., "Holey Fibers with Random Cladding Distributions," Optics Letters, Feb. 15, 2000, vol. 25, No. 4, pp. 206-208.
Moreira, J.D., et al., "Diversity Techniques for OFDM Based WLAN Systems," The 13th IEEE International Symposium on Personal, Indoor and Mobile Radio Communications, Sep. 15-18, 2002, vol. 3, pp. 1008-1011.
Niiho, T., et al., "Multi-Channel Wireless LAN Distributed Antenna System Based on Radio-Over-Fiber Techniques," The 17th Annual Meeting of the IEEE Lasers and Electro-Optics Society, Nov. 2004, vol. 1, pp. 57-58.
Author Unknown, "ITU-T G.652, Telecommunication Standardization Sector of ITU, Series G: Transmission Systems and Media, Digital Systems and Networks, Transmission Media and Optical Systems Characteristics—Optical Fibre Cables, Characteristics of a Single-Mode Optical Fiber and Cable," ITU-T Recommendation G.652, International Telecommunication Union, Jun. 2005, 22 pages.
Author Unknown, "ITU-T G.657, Telecommunication Standardization Sector of ITU, Dec. 2006, Series G: Transmission Systems and Media, Digital Systems and Networks, Transmission Media and Optical Systems characteristics—Optical Fibre Cables, Characteristics of a Bending Loss Insensitive Single Mode Optical Fibre and Cable for the Access Network," ITU-T Recommendation G.657, International Telecommunication Union, 20 pages.
Author Unknown, RFID Technology Overview, Date Unknown, 11 pages.
Opatic, D., "Radio over Fiber Technology for Wireless Access," Ericsson, Oct. 17, 2009, 6 pages.
Paulraj, A.J., et al., "An Overview of MIMO Communications—A Key to Gigabit Wireless," Proceedings of the IEEE, Feb. 2004, vol. 92, No. 2, 34 pages.
Pickrell, G.R., et al., "Novel Techniques for the Fabrication of Holey Optical Fibers," Proceedings of SPIE, Oct. 28-Nov. 2, 2001, vol. 4578, 2001, pp. 271-282.
Roh, W., et al., "MIMO Channel Capacity for the Distributed Antenna Systems," Proceedings of the 56th IEEE Vehicular Technology Conference, Sep. 2002, vol. 2, pp. 706-709.
Schweber, Bill, "Maintaining cellular connectivity indoors demands sophisticated design," EDN Network, Dec. 21, 2000, 2 pages, http://www.edn.com/design/integrated-circuit-design/4362776/Maintaining-cellular-connectivity-indoors-demands-sophisticated-design.
Seto, L, et al., "Antenna-Selective Transmit Diversity Technique for OFDM-Based WLANs with Dual-Band Printed Antennas," 2005 IEEE Wireless Communications and Networking Conference, Mar. 13-17, 2005, vol. 1, pp. 51-56.
Shen, C., et al., "Comparison of Channel Capacity for MIMO-DAS versus MIMO-CAS," The 9th Asia-Pacific conference on Communications, Sep. 21-24, 2003, vol. 1, pp. 113-118.
Wake, D. et al., "Passive Picocell: A New Concept n Wireless Network Infrastructure," Electronics Letters, Feb. 27, 1997, vol. 33, No. 5, pp. 404-406.
Windyka, John et al., "System-Level Integrated Circuit (SLIC) Technology Development for Phased Array Antenna Applications," Contractor Report 204132, National Aeronautics and Space Administration, Jul. 1997, 94 pages.
Winters, J., et al., "The Impact of Antenna Diversity on the Capacity of Wireless Communications Systems," IEEE Transcations on Communications, vol. 42, No. 2/3/4, Feb./Mar./Apr. 1994, pp. 1740-1751.
Yu et al., "A Novel Scheme to Generate Single-Sideband Millimeter-Wave Signals by Using Low-Frequency Local Oscillator Signal," IEEE Photonics Technology Letters, vol. 20, No. 7, Apr. 1, 2008, pp. 478-480.
Patent Cooperation Treaty, International Search Report for application PCT/IL15/050548, dated Oct. 28, 2015, 3 pages.

* cited by examiner

SYSTEMS AND METHODS FOR SIMULTANEOUS SAMPLING OF SERIAL DIGITAL DATA STREAMS FROM MULTIPLE ANALOG-TO-DIGITAL CONVERTERS (ADCS), INCLUDING IN DISTRIBUTED ANTENNA SYSTEMS

BACKGROUND

The disclosure relates generally to sampling analog-to-digital converters (ADCs), and more particularly to providing devices, systems, and methods, including in distributed antenna systems (DASs), to simultaneously sample ADCs.

An ADC converts an analog input signal into a digital output signal. The digital output signal is a digital representation or value of the analog input signal. For example, for an 8-bit ADC having a digital output signal range of 0-255 (i.e., 0xFF), an analog signal having an amplitude of the maximum range of the ADC would be converted to the digital value 255. This conversion takes a specific amount of time for the ADC to complete, depending on such factors as the method used by the ADC for the conversion, the desired level of precision, and the signal processing capabilities of the ADC. ADCs can be deployed in systems, including communications systems that carry analog communications signals, to convert analog signals to digital values for further processing and analysis in a digital domain.

A DAS is a type of communications system that may distribute analog communications signals. In a DAS, communications signals can be distributed from a central unit (which can also be referred to as a head-end unit) to one or more remote units forming remote coverage areas. ADCs may be provided in communications components in a DAS to sample distributed communications signals or to convert detected information about the distributed communications signals, such as radio frequency (RF) power, from an analog value to a digital value for analysis and processing. In this regard, FIG. 1 illustrates an exemplary DAS 10 that can include ADCs 12(1)-12(N) (only one ADC, 12(1) is shown) to convert analog signals distributed in the DAS 10 to digital values. The DAS 10 provides distribution of communications signals to provide communications services to coverage areas 14(1)-14(N) in the DAS 10, where N is the number of coverage areas. These communications services can include cellular services, such as a cellular service operating using the Long Term Evolution (LTE) cellular protocol, for example. The coverage areas 14(1)-14(N) may be remotely located. In this case, the remote coverage areas 14(1)-14(N) are created by and centered on remote antenna units 16(1)-16(N) coupled to a central unit 18 (e.g., a head-end controller or head-end unit). The central unit 18 may be communicatively coupled to a base station 20. In this regard, the central unit 18 receives analog downlink communications signals 22D from the base station 20 to be distributed to the remote antenna units 16(1)-16(N). The remote antenna units 16(1)-16(N) are configured to receive the downlink communications signals 22D from the central unit 18 over a communications medium 24 to be distributed to the respective coverage areas 14(1)-14(N) of the remote antenna units 16(1)-16(N). Each remote antenna unit 16(1)-16(N) may include one or more RF transmitters/receivers (not shown) and respective antennas 26(1)-26(N) operably coupled to the RF transmitters/receivers to wirelessly distribute the communications services to client devices 28 within their respective coverage areas 14(1)-14(N). The remote antenna units 16(1)-16(N) are also configured to receive analog uplink communications signals 22U from the client devices 28 in their respective coverage areas 14(1)-14(N) to be distributed to the base station 20.

It may be desired to determine information regarding the downlink communications signals 22D and/or the uplink communications signals 22U distributed in the DAS 10 for diagnostic or operational reasons. For example, it may be desired to determine the RF power level of the downlink and/or the uplink communications signals 22D, 22U. The RF power levels may be used to calibrate gain levels in the DAS 10 or determine if any communications component is not distributing a downlink and/or an uplink communications signal 22D, 22U with the proper gain. In this regard, power detectors 30(1)-30(N) (only one power detector, 30(1) is shown) can be provided at specific points in the DAS 10. The power detectors 30(1)-30(N) each provide a respective output signal 32(1)-32(N) (only one output signal, 32(1) is shown) indicative of the RF power in a downlink and/or an uplink communications signal 22D, 22U at such point or location. The output signals indicative of RF power generated by the power detectors 30(1)-30(N) are also typically analog signals. However, it may be desired to process these output signals in a digital domain, such as in a microcontroller unit (MCU) 34 shown in FIG. 1. Thus, the ADCs 12(1)-12(N) are employed in FIG. 1 to convert the analog output signals 32(1)-32(N) generated by the power detectors 30(1)-30(N) to respective digital data streams 36(1)-36(N) (only one digital data stream, 36(1) is shown). The MCU 34 may then perform processing, including inter-sample processing (e.g., calculating average power of every stream), of the digital data streams 36(1)-36(N) collected from the multiple ADCs 12(1)-12(N) at multiple locations in the DAS 10.

As the desire to obtain more information about downlink and/or uplink communications signals 22D, 22U in different frequency bands or points in the DAS 10 increases, the number of ADCs 12(1)-12(N) provided in the DAS 10 increases. Thus, the MCU 34 must sample an increased number of digital data streams 36(1)-36(N) from the ADCs 12(1)-12(N), which consumes an increasing percentage of the resources of the MCU 34. This increase in resources consumed by sampling the ADCs 12(1)-12(N) leads to fewer resources available for other tasks the MCU 34 must perform.

Several solutions to this problem of decreased MCU 34 availability exist. First, an MCU 34 with increased signal processing capabilities can be used. This may also require that the ADCs 12(1)-12(N) have increased signal processing capabilities. Providing an MCU 34 and ADCs 12(1)-12(N) in the DAS 10 with increased processing capabilities may be more expensive than providing less expensive MCU and ADCs with reduced processing capabilities. Second, an additional MCU 34 may be provided in the DAS 10 that is dedicated to sampling the ADCs 12(1)-12(N) within the required time.

No admission is made that any reference cited herein constitutes prior art. Applicant expressly reserves the right to challenge the accuracy and pertinence of any cited documents.

SUMMARY

Embodiments disclosed herein include systems and methods for simultaneous sampling of serial digital data streams from multiple analog-to-digital converters (ADCs), including in distributed antenna systems (DASs). In this regard, in one embodiment, a controller unit is provided. The controller unit is configured to sample a plurality of serial digital data streams simultaneously or substantially simultaneously (referred to herein as "simultaneously"). As a non-limiting example, the plurality of serial digital data streams may represent digital information regarding power levels at multiple points in a communications system, such as a DAS. Simultaneously sampling the serial digital data streams enables the controller unit to perform high speed measurements of all data streams at once, while consuming minimal processor time. To allow the controller unit to efficiently sample the multiple serial digital data streams simultaneously from a plurality of ADCs, the controller unit is configured to provide a plurality of data input ports. To allow the controller unit to simultaneously sample the multiple data streams from the multiple ADCs on the plurality of data input ports in an efficient parallel manner, as opposed to one at a time and serially, each of the ADCs is coupled to a common chip select port and a common clock signal port on the controller unit. The controller unit communicates a chip select signal on the chip select port to activate all of the ADCs simultaneously in order to cause each of the ADCs to provide its respective digital data stream to the respective data input port of the controller unit simultaneously for sampling. As a result, fewer or lower-cost components may be used to sample multiple ADCs.

One embodiment of the disclosure relates to a system for simultaneous sampling of serial digital data streams from multiple ADCs. The system for simultaneous sampling of serial digital data streams from multiple ADCs comprises a controller unit and a plurality of ADCs. The controller unit comprises a chip select output port; a clock output port; and a plurality of data input ports, each configured to receive a serial digital data stream. The controller unit also comprises a processor configured to communicate a chip select signal on the chip select output port to receive a serial digital data stream on each of the plurality of data input ports simultaneously. The processor is also configured to communicate a clock signal on the clock output port. Each ADC among the plurality of ADCs comprises a chip select input port electrically coupled to the chip select output port of the controller unit. Each ADC also comprises a clock input port electrically coupled to the clock output port of the controller unit, and a data output port electrically coupled to a corresponding data input port among the plurality of data input ports of the controller unit. Each ADC is configured to provide a serial digital data stream on the data output port in response to receiving the clock signal on the clock input port, if the chip select signal is present on the chip select input port.

An additional embodiment of the disclosure relates to a method for simultaneously sampling serial digital data streams from multiple ADCs. The method comprises communicating a chip select signal to a plurality of chip select input ports in a corresponding plurality of ADCs to simultaneously activate the plurality of ADCs. The method further comprises communicating a clock signal to a corresponding plurality of clock input ports in the plurality of ADCs. The method further comprises simultaneously receiving a plurality of serial digital data streams from the corresponding plurality of ADCs in a corresponding data input port among a plurality of data input ports. The method further comprises simultaneously sampling the plurality of serial digital data streams received in the plurality of data input ports from the plurality of ADCs.

An additional embodiment of the disclosure relates to a DAS comprising a plurality of communications components. The plurality of communications components comprises a central unit and a plurality of remote units. The central unit is configured to receive a downlink communications signal from a communications system and distribute the downlink communications signal over at least one downlink communications medium to a plurality of remote units. Each remote unit among the plurality of remote units is configured to receive the downlink communications signal from the central unit over the at least one downlink communications medium and distribute the downlink communications signal to a client device.

The DAS also comprises a controller unit comprising a chip select output port; a clock output port; and a plurality of data input ports, each configured to receive a serial digital data stream. The controller unit also comprises a processor configured to communicate a chip select signal on the chip select output port to receive a serial digital data stream on each of the plurality of data input ports simultaneously, and to communicate a clock signal on the clock output port.

The DAS also comprises a plurality of signal detectors associated with at least one of the plurality of communication components. Each signal detector among the plurality of signal detectors comprises an interface to receive at least a portion of an analog communications signal from the DAS, and an ADC. The ADC comprises a chip select input port electrically coupled to the chip select output port of the controller unit; a clock input port electrically coupled to the clock output port of the controller unit; and a data output port electrically coupled to a corresponding data input port among the plurality of data input ports of the controller unit. The ADC is configured to receive an analog signal from the corresponding signal detector and convert the analog signal to provide the serial digital data stream on the data output port in response to receiving the clock signal on the clock input port, if the chip select signal is present on the chip select input port.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Various embodiments will be further clarified by the following examples.

Figure 1:
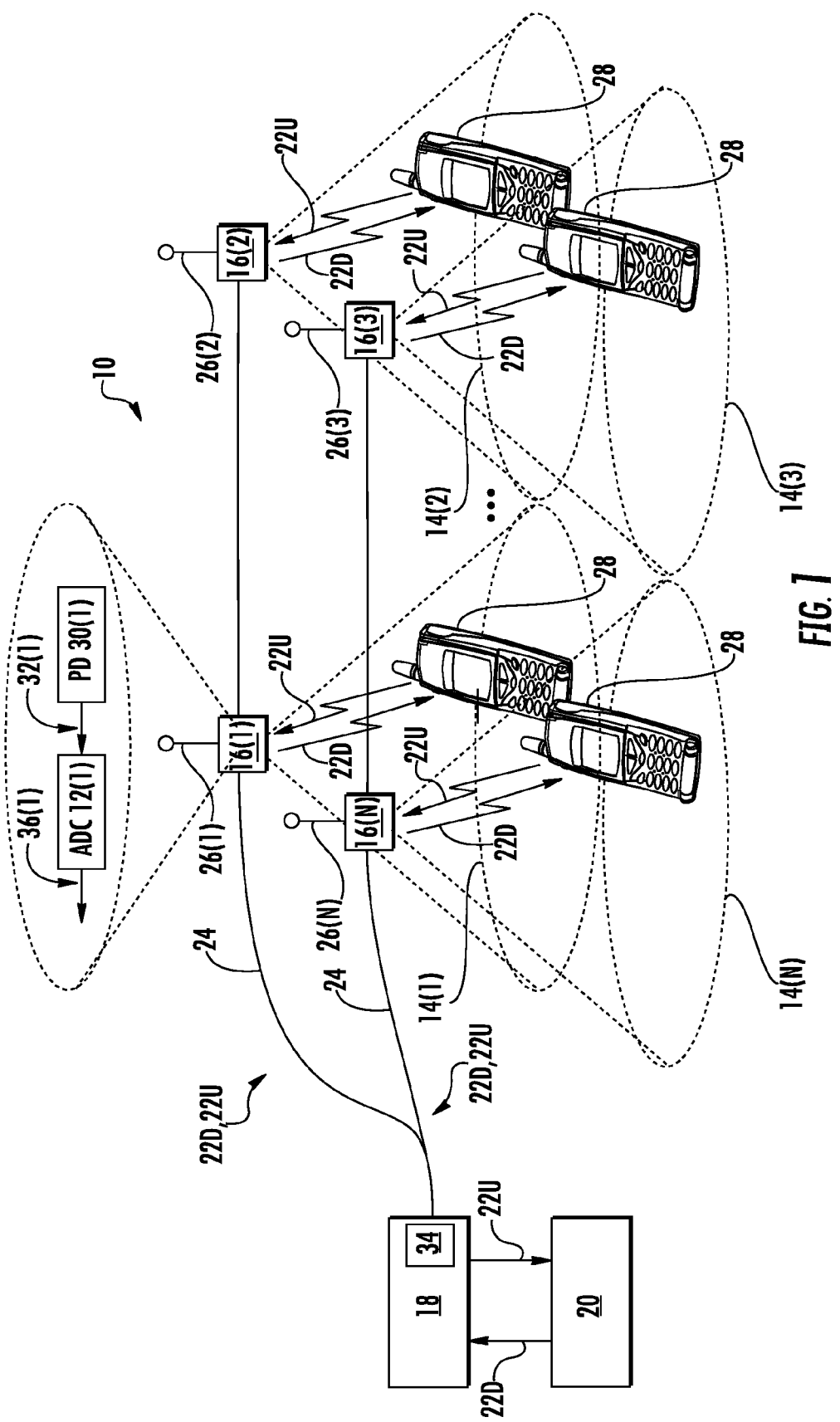
FIG. 1 is a schematic diagram of an exemplary distributed antenna system (DAS) capable of distributing radio frequency (RF) communications services to client devices, wherein the DAS may include multiple analog-to-digital converters (ADCs) that can convert analog data regarding communications signals to digital data.
Figure 2:
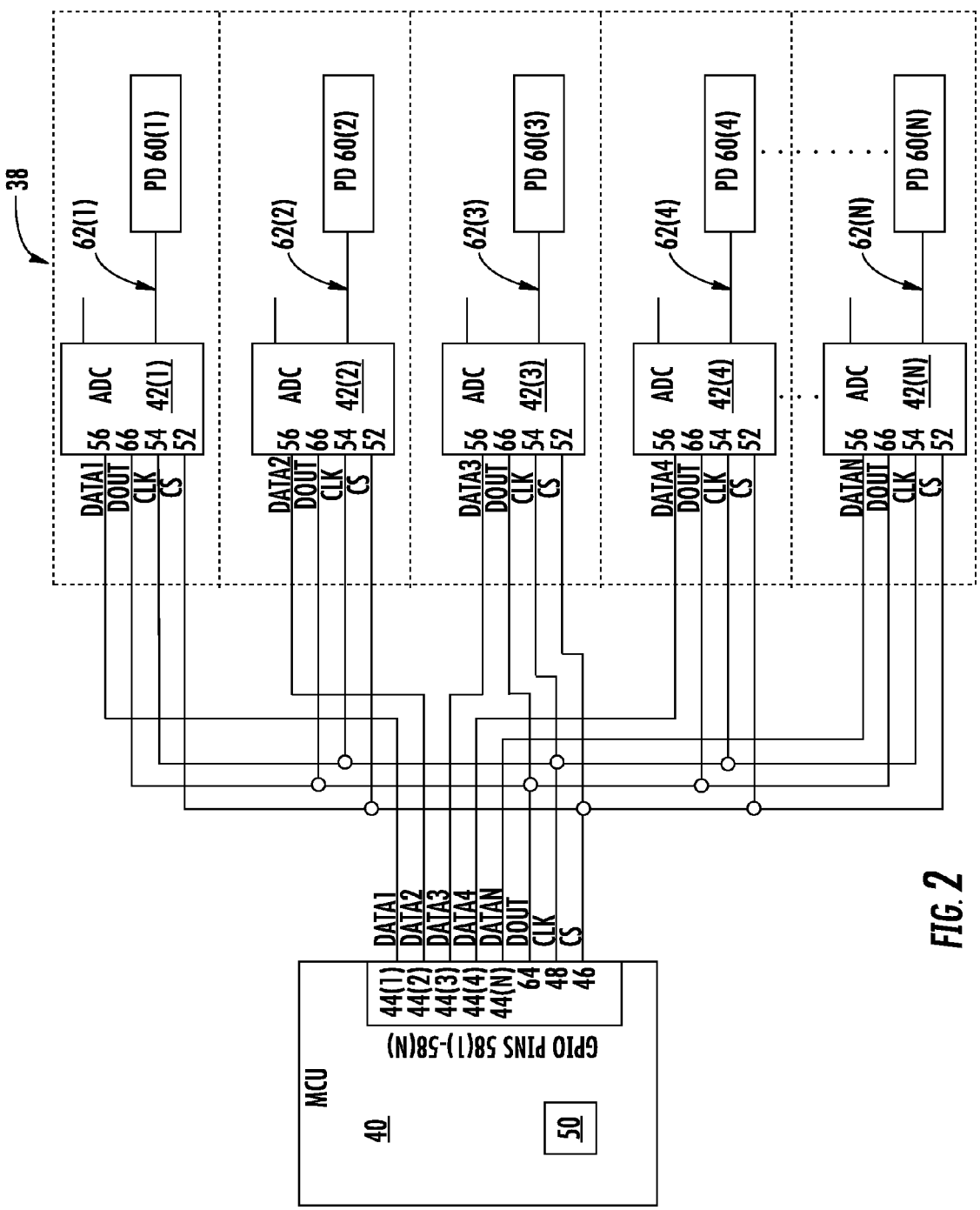
FIG. 2 is a schematic diagram of an exemplary system that includes a controller unit capable of simultaneously sampling serial digital data streams from multiple ADCs, according to one embodiment.

Embodiments disclosed herein include systems and methods for simultaneous sampling of serial digital data streams from multiple analog-to-digital converters (ADCs), including in distributed antenna systems (DASs). In this regard, FIG. 2 is a schematic diagram of an exemplary system 38 that includes a microcontroller unit (MCU) 40 as a controller unit capable of simultaneously sampling serial digital data streams DATA1-DATAN from multiple ADCs 42(1)-42(N). The MCU 40 is configured to sample a plurality of serial digital data streams DATA1-DATAN simultaneously or substantially simultaneously (referred to herein as "simultaneously"). The term "simultaneous sampling" is used herein in contrast to serial sampling, where a first sampling is concluded before the next can begin. In simultaneous sampling, multiple inputs can be processed at essentially the same time. Simultaneously sampling the serial digital data streams DATA1-DATAN enables the controller to perform high speed measurements of all data streams at once, while consuming minimal processor time. To allow the MCU 40 to efficiently sample the multiple serial digital data streams DATA1-DATAN from multiple ADCs 42(1)-42(N) simultaneously, the MCU 40 is configured to provide a plurality of data input ports 44(1)-44(N). To allow the MCU 40 to simultaneously sample the multiple serial digital data streams DATA1-DATAN from the multiple ADCs 42(1)-42(N) on the plurality of data input ports 44(1)-44(N) in an efficient parallel manner, as opposed to one at a time and serially, each of the ADCs 42(1)-42(N) is coupled to a common chip select port 46 and a common clock signal port 48 on the MCU 40. The MCU 40 communicates a chip select signal CS on the chip select port 46 to activate all of the ADCs 42(1)-42(N) simultaneously in order to cause each of the ADCs 42(1)-42(N) to provide its respective serial digital data stream DATA1-DATAN to the respective data input port 44(1)-44(N) of the MCU 40 simultaneously for sampling. As a result, fewer or lower-cost components may be used to sample multiple ADCs 42(1)-42(N).

More specifically, in the system 38 for simultaneous sampling of serial digital data streams DATA1-DATAN from multiple ADCs 42(1)-42(N) the MCU 40 comprises a chip select output port 46; a clock output port 48; and a plurality of data input ports 44(1)-44(N), each configured to receive a serial digital data stream DATA1-DATAN. The MCU 40 also comprises a processor 50 configured to communicate a chip select signal CS on the chip select output port 46 to receive a serial digital data stream DATA1-DATAN on each of the plurality of data input ports 44(1)-44(N) simultaneously. The processor 50 is also configured to communicate a clock signal CLK on the clock output port 48. Each ADC 42 among the plurality of ADCs 42(1)-42(N) comprises a chip select input port 52 electrically coupled to the chip select output port 46 of the MCU 40. Each ADC 42 also comprises a clock input port 54 electrically coupled to the clock output port 48 of the MCU 40, and a data output port 56 electrically coupled to a corresponding data input port 44 among the plurality of data input ports 44(1)-44(N) of the MCU 40. Each ADC 42 is configured to provide a serial digital data stream DATA1-DATAN on the data output port 56 in response to receiving the clock signal CLK on the clock input port 54, if the chip select signal CS is present on the chip select input port 52.

In the embodiment of FIG. 2, the various ports of the MCU 40 are appropriately configured general purpose input/output (GPIO) pins 58(1)-58(N). Before discussing the system 38 for simultaneously sampling serial digital data streams from multiple ADCs, the components of the system in FIG. 2 will be described below. In this example, each ADC 42 is configured to convert an analog signal obtained from a corresponding power detector (PD) 60(1)-60(N) into a digital signal. The PDs 60(1)-60(N) each provide a respective output signal 62(1)-62(N) indicative of the power in an analog signal at a point or location where the respective PD 60(1)-60(N) is located. The output signals 62(1)-62(N) indicative of power generated by the PDs 60(1)-60(N) are also typically analog signals. However, processing these output signals 62(1)-62(N) in a digital domain, such as in the MCU 40, may be desired. Thus, the ADCs 42(1)-42(N) are employed to convert the analog output signals 62(1)-62(N) generated by the PDs 60(1)-60(N) to respective multiple serial digital data streams DATA1-DATAN. The MCU 40 may then perform processing, including inter-sample processing (e.g., calculating average power of every stream), of the multiple serial digital data streams DATA1-DATAN collected from the multiple ADCs 42(1)-42(N).

In FIG. 2, the MCU 40 is configured to sample the ADCs 42(1)-42(N) simultaneously. Simultaneously sampling the ADCs 42(1)-42(N) enables the MCU 40 to perform high speed measurements of the multiple serial digital data streams DATA1-DATAN collected from the multiple ADCs 42(1)-42(N) at once, while consuming minimal processor time. To allow the MCU 40 to sample the multiple serial digital data streams DATA1-DATAN simultaneously from a plurality of ADCs 42(1)-42(N), the MCU 40 is configured to provide a plurality of data input ports 44(1)-44(N). To allow the MCU 40 to simultaneously sample the multiple serial digital data streams DATA1-DATAN from the multiple ADCs 42(1)-42(N) on the plurality of data input ports 44(1)-44(N) in an efficient, parallel manner, as opposed to serially sampling one ADC 42 at a time, each of the ADCs 42(1)-42(N) is coupled to a common chip select port 46 and a common clock signal port 48 on the MCU 40. In operation, the MCU 40 communicates a chip select signal CS on the chip select port 46 to activate all of the ADCs 42(1)-42(N) simultaneously. The MCU 40 also communicates a clock signal CLK on the clock signal port 48 to cause each of the ADCs 42(1)-42(N) to provide its respective serial digital data stream DATA1-DATAN to the respective data input port 44(1)-44(N) of the MCU 40 simultaneously for sampling. In this embodiment, the MCU 40 is additionally configured to provide a data output signal (or configuration signal) DOUT on a data output port 64 that is shared among all of the ADCs 42(1)-42(N). Each ADC 42 receives this signal on a data input port 66. This data output signal DOUT can be used to configure the ADCs 42(1)-42(N). For example, the ADCs 42(1)-42(N) can be configured to use a specific conversion algorithm, use a specific precision, or convert a specific channel. As discussed previously, in this embodiment, the plurality of data input ports 44(1)-44(N), the chip select port 46, the clock signal port 48, and the data output port 64 are appropriately configured GPIO pins 58(1)-58(N) of the MCU 40.

Figure 3:
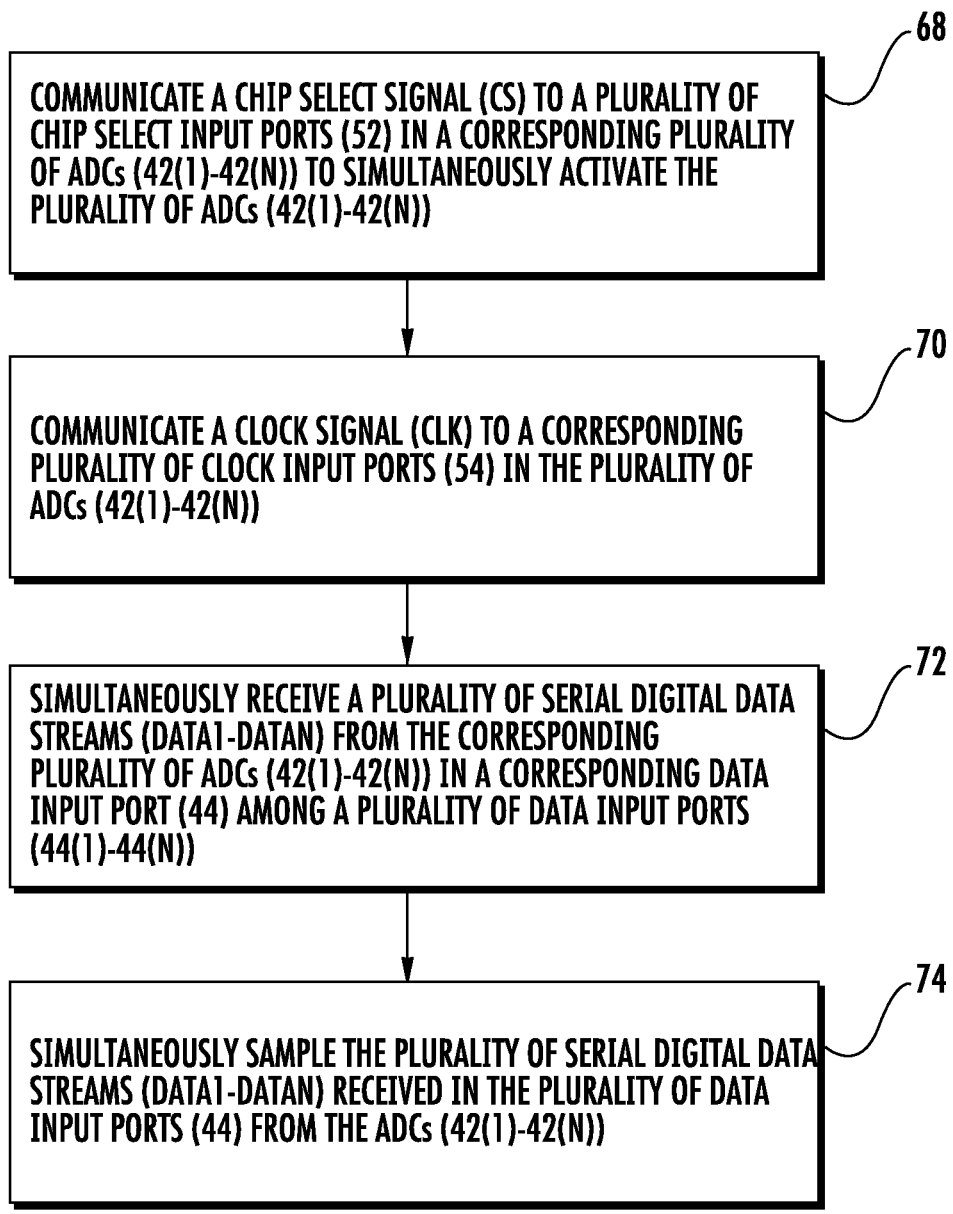
FIG. 3 is a flowchart illustrating an exemplary process of operating the controller unit in FIG. 2 for simultaneously sampling serial digital data streams from multiple ADCs, according to one embodiment.
Figure 4:
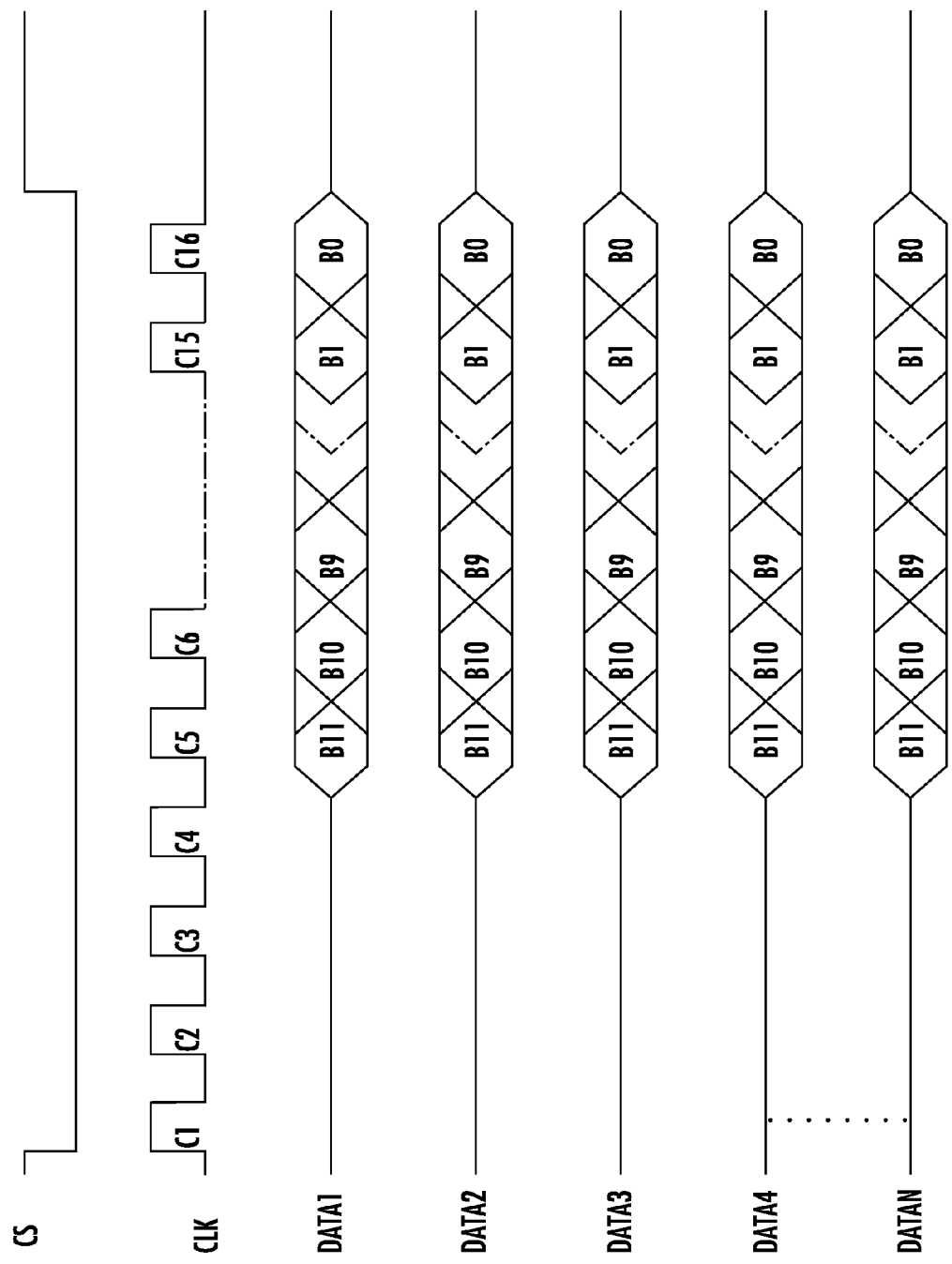
FIG. 4 illustrates a relationship between a chip select signal, a clock signal, and data output signals corresponding to an exemplary operation of the system of FIG. 2, according to one embodiment.

To further explain an exemplary process of operating the system 38 in FIG. 2 for simultaneously sampling serial digital data streams DATA1-DATAN from multiple ADCs 42(1)-42(N), the flowchart in FIG. 3 is provided. Additionally, FIG. 4 illustrates a relationship between the chip select signal CS, the clock signal CLK, and the serial digital data streams DATA1-DATAN corresponding to an exemplary operation of the system of FIG. 2, according to one embodiment. The process of FIG. 3 and the signals shown in FIG. 4 can represent one embodiment where each of the ADCs 42(1)-42(N) is configured to provide the serial digital data stream DATA1-DATAN according to a serial peripheral interface (SPI) protocol. Other communications protocols could also be used. As discussed above, the MCU 40 first communicates a chip select signal CS to a plurality of chip select input ports 52 in a corresponding plurality of ADCs 42(1)-42(N) to simultaneously activate the plurality of ADCs 42(1)-42(N) (block 68). This is shown in FIG. 4 by the chip select signal CS transitioning from a high value to a low value. Other embodiments may communicate a chip select signal CS by transitioning from a low value to a high value, depending on implementation of the ADCs 42(1)-42(N). Next, the MCU 40 communicates a clock signal CLK to a corresponding plurality of clock input ports 54 in the plurality of ADCs 42(1)-42(N) (block 70). The CLK signal oscillates between a low value to a high value and back to the low value. The clock pulses of the clock pulse signal CLK are numbered C1 through C16 in FIG. 4. Because the ADCs 42(1)-42(N) receive the same chip select signal CS and the same clock signal CLK, the ADCs 42(1)-42(N) simultaneously convert the respective analog signals to digital signals. As discussed above, this conversion takes a specific amount of time to complete. After completion of the conversion, the ADCs 42(1)-42(N) will begin to provide the resultant data to the MCU 40. The MCU 40 simultaneously receives a plurality of serial digital data streams DATA1-DATAN from the corresponding plurality of ADCs 42(1)-42(N) in a corresponding data input port 44 among a plurality of data input ports 44(1)-44(N) (block 72). In FIG. 4, no changes are shown in the serial digital data streams DATA1-DATAN during the first four clock pulses C1-C4 due to the amount of time the ADCs 42(1)-42(N) need to complete the conversion process and begin transmitting data. In this embodiment, the ADCs 42(1)-42(N) take four clock pulses to complete the conversion process. During the fifth clock pulse, each of the serial digital data streams DATA1-DATAN may transition to either a low value or a high value, depending on the value of the data (i.e., zero or one). This first bit transmitted during the fifth clock pulse is labelled "B11" because in this embodiment, the ADCs 42(1)-42(N) provide twelve bits of precision and the ADCs 42(1)-42(N) communicate the most significant bit first. The clock pulses continue and the serial digital data streams DATA1-DATAN are communicated simultaneously. Clock pulse sixteen C16 is the last clock pulse in this embodiment, and the last bit, "B0," is transmitted by each of the ADCs 42(1)-42(N). Now that the MCU 40 has received the data on the data input ports 44(1)-44(N), the MCU 40 may simultaneously sample the plurality of serial digital data streams DATA1-DATAN received in the plurality of data input ports 44(1)-44(N) from the ADCs 42(1)-42(N) (block 74). In some embodiments, the MCU 40 stops communicating a chip select signal CS on the chip select port 46. This is shown by the chip select signal CS transitioning from the low value to the high value in FIG. 4. In some embodiments, this transition deactivates the ADCs 42(1)-42(N). The process described in FIG. 3 can be initiated or repeated as desired, because as discussed above, the ADCs 42(1)-42(N) may be configured to provide the result of the conversion in more than one bit of digital data, usually eight data bits or more. One embodiment that repeats this process is described next.

Figure 5:
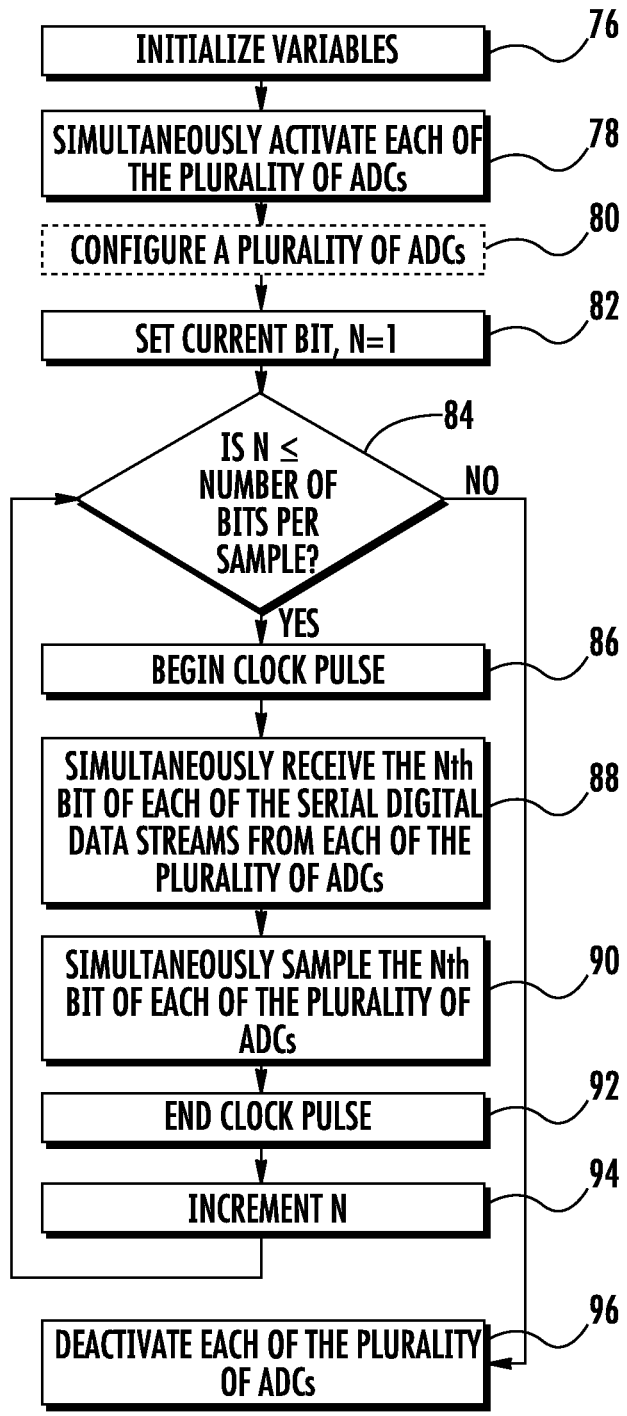
FIG. 5 is a more detailed flowchart illustrating an exemplary process of operating the controller unit in FIG. 2 for simultaneously sampling serial digital data streams from multiple ADCs, according to one embodiment.

FIG. 5 is a more detailed flowchart illustrating a process for simultaneously sampling serial digital data streams DATA1-DATAN from multiple ADCs 42(1)-42(N), according to one embodiment. First, a controller unit, such as the MCU 40 of FIG. 2, will initialize variables that will be used in the process (block 76). In some implementations, this may involve assigning each variable a value of zero (0) or some other initial value. Next, the MCU 40 communicates a chip select signal to a plurality of chip select input ports 52 in a corresponding plurality of ADCs 42(1)-42(N) to simultaneously activate each of the plurality of ADCs 42(1)-42(N) (block 78). In one implementation, the chip select signal begins with a transition of the signal from a high value to a low value, as discussed previously in relation to the chip select signal CS in FIG. 3. Other implementations can reverse or otherwise alter this transition. Optionally, the MCU 40 may also configure the plurality of ADCs 42(1)-42(N) as discussed above (block 80). At this point, the MCU 40 knows the number of bits of data to expect in the serial digital data streams DATA1-DATAN transmitted by each of the ADCs 42(1)-42(N) either by prior configuration or from the previous configuration step. A counter representing the current bit, N, to be sampled from the serial digital data streams DATA1-DATAN is set to one (1) in preparation for receiving the first data bit (block 82). Depending on implementation, this counter may instead start from zero (0), or from a higher number that is subsequently decremented. Also, as discussed above, ADCs 42(1)-42(N) may be configured to provide the most significant bit or the least significant bit first. Next, a loop begins that first checks whether the process has completed. This completion check is performed by comparing the counter representing the current bit, N, to be sampled from the serial digital data streams DATA1-DATAN with the number of bits of data to expect in the serial digital data streams DATA1-DATAN transmitted by each of the ADCs 42(1)-42(N) (block 84). If there are bits remaining to sample, the MCU 40 begins a clock pulse which communicates a clock signal to a corresponding plurality of clock input ports 48 in the plurality of ADCs 42(1)-42(N) (block 86). As discussed above in relation to the clock signal CLK in FIG. 3, the beginning of the clock pulse is a transition from a low value to a high value, in this example. Other implementations can reverse or otherwise alter this transition. The MCU 40 simultaneously receives the Nth bit of each of a plurality of serial digital data streams DATA1-DATAN from the corresponding plurality of ADCs 42(1)-42(N) in a corresponding data input port 44 among a plurality of data input ports 44(1)-44(N) (block 88). Now that the MCU 40 has received the Nth bit on the data input ports 44(1)-44(N), the MCU 40 may simultaneously sample the Nth bit of the plurality of serial digital data streams DATA1-DATAN received in the plurality of data input ports 44(1)-44(N) from the ADCs 42(1)-42(N) (block 90). After sampling the Nth bit, the MCU 40 ends the clock pulse (block 92). This transition is the opposite of the beginning of the clock pulse and, in this example, is a transition from a high value to a low value. The MCU 40 then increments the counter representing the current bit, N, to be sampled from the serial digital data streams DATA1-DATAN (block 94) and returns to block 84 to check whether the process has completed. If there are no bits remaining to sample, the MCU 40 stops communicating the chip select signal to the plurality of chip select input ports 52 in the corresponding plurality of ADCs 42(1)-42(N) to simultaneously deactivate each of the plurality of ADCs 42(1)-42(N) (block 96).

Figure 6:
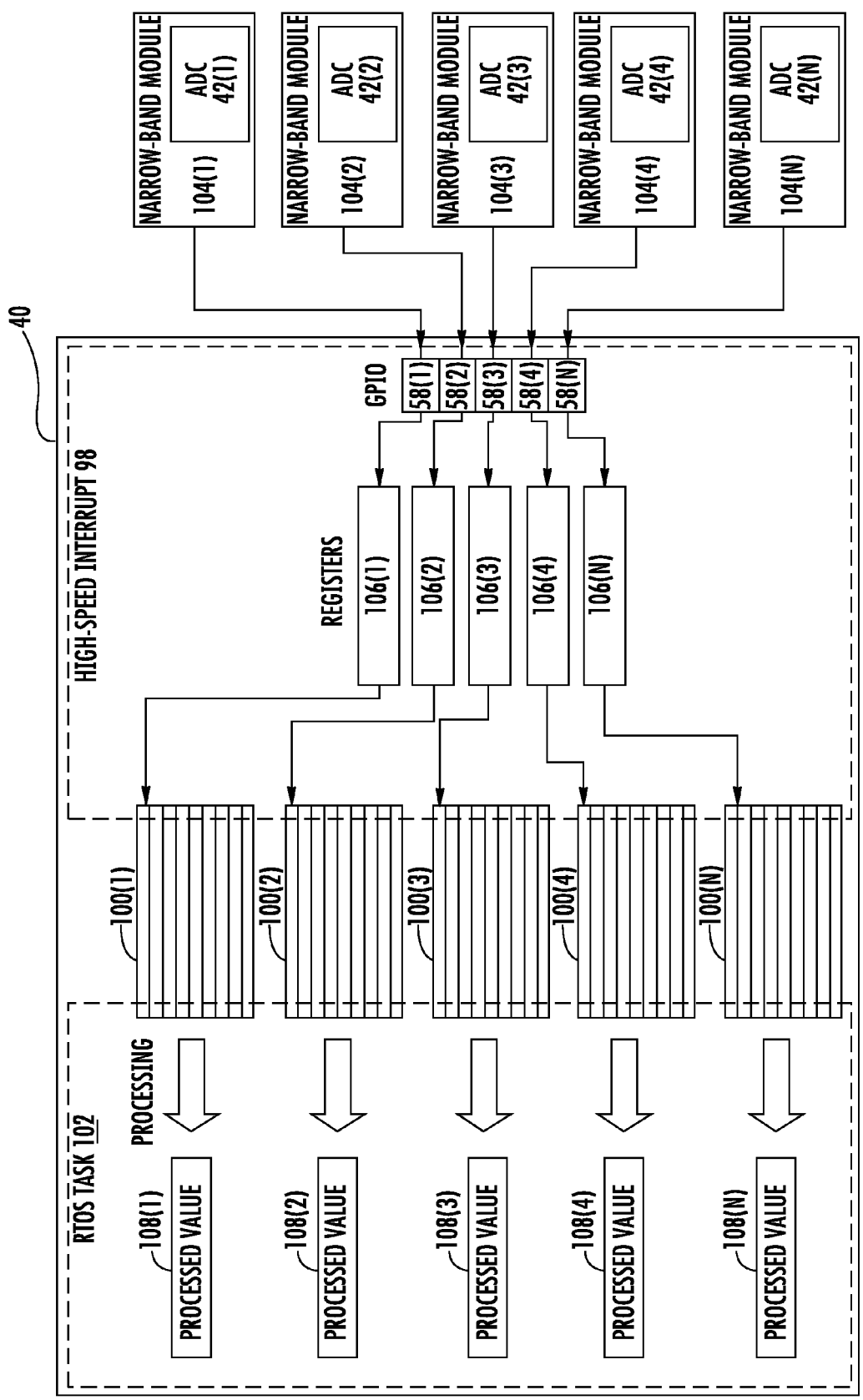
FIG. 6 illustrates a logical configuration of a controller unit simultaneously sampling serial digital data streams from multiple ADCs, according to one embodiment.

FIG. 6 illustrates a logical configuration of a controller unit, such as the MCU 40 of FIG. 2, simultaneously sampling serial digital data streams DATA1-DATAN from multiple ADCs 42(1)-42(N), according to one embodiment. This logical configuration is only one possible implementation and other configurations exist. In this embodiment, the MCU 40 is shown as consisting of two logical processing portions. The first logical processing portion of the MCU 40 is the high-speed interrupt portion 98 that is configured to obtain samples to store in memory blocks 100(1)-100(N). The second logical processing portion of the MCU 40 is the real-time operating system (RTOS) task portion 102 that is configured to process the samples stored in memory blocks 100(1)-100(N) obtained by the high-speed interrupt portion 98. Both of these logical processing portions of the MCU 40 must share processing resources such as processing time. As discussed previously, by simultaneously sampling serial digital data streams DATA1-DATAN from multiple ADCs 42(1)-42(N), fewer processing resources need to be used in the high-speed interrupt portion 98 of the MCU 40, which allows for more processing resources to be available for the RTOS task portion 102 to process samples stored in memory blocks 100(1)-100(N) obtained by the high-speed interrupt portion 98 and for other MCU 40 tasks.

FIG. 6 shows an arrangement similar to the one in FIG. 2, where serial digital data streams DATA1-DATAN are simultaneously sampled. In this embodiment, the serial digital data streams DATA1-DATAN are sampled from N narrow-band modules 104(1)-104(N). Each of these narrow-band modules 104(1)-104(N) are configured to provide serial digital data streams DATA1-DATAN indicative of some value related to a narrow-band analog RF signal. These narrow-band modules 104(1)-104(N) include ADCs 42(1)-42(N) and a signal detector (not shown) capable of detecting some value related to the narrow-band analog RF signal.

The high-speed interrupt portion 98 of the MCU 40 is shown simultaneously receiving the serial digital data streams DATA1-DATAN on a plurality of GPIO pins 58 from the narrow-band modules 104(1)-104(N). The serial digital data streams DATA1-DATAN are then stored in registers 106(1)-106(N) until all bits of the serial digital data streams DATA1-DATAN are sampled. The high-speed interrupt portion 98 of the MCU 40 can then place the data received from the serial digital data streams DATA1-DATAN from the registers 106(1)-106(N) to the corresponding memory blocks 100(1)-100(N). In FIG. 6, the memory blocks 100(1)-100(N) are shown as separate memory blocks corresponding to the serial digital data streams DATA1-DATAN, but other implementations are possible and the samples may all be located in the same memory block.

Once the memory blocks 100(1)-100(N) are full (i.e., the memory blocks 100(1)-100(N) contain as many samples as required), the RTOS task portion 102 can process the samples in memory blocks 100(1)-100(N) to compute processed values 108(1)-108(N) corresponding to the serial digital data streams DATA1-DATAN. In an example where the serial digital data streams DATA1-DATAN are indicative of RF power, the processing by the RTOS task portion 102 can be performed in order to determine peak and average power for each of the narrow-band modules 104(1)-104(N).

Figure 7:
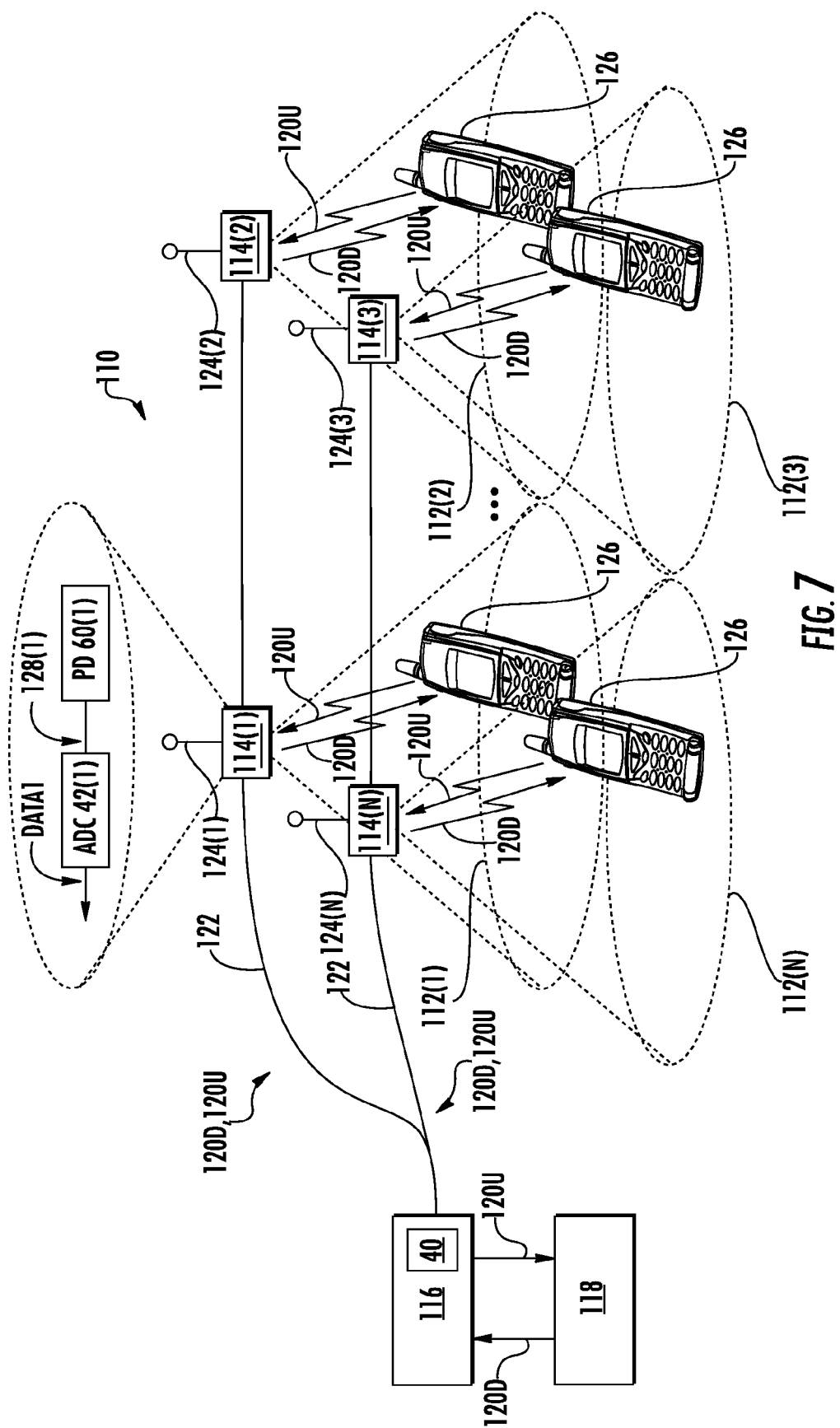
FIG. 7 is a schematic diagram of an exemplary DAS capable of distributing RF communications services to client devices, wherein the DAS may include multiple ADCs that can convert analog data regarding communications signals to digital data, and further comprising a microcontroller unit (MCU) capable of simultaneously sampling serial digital data streams from the multiple ADCs, according to one embodiment.

FIG. 7 illustrates an exemplary DAS 110 that can include ADCs 42(1)-42(N) (only one ADC, 42(1) is shown) to convert analog signals distributed in the DAS 110 to digital values. The DAS 110 provides distribution of communications signals to provide communications services to coverage areas 112(1)-112(N) in the DAS 110, where N is the number of coverage areas. These communications services can include cellular services, such as a cellular service operating using the Long Term Evolution (LTE) cellular protocol, for example. The coverage areas 112(1)-112(N) may be remotely located. In this case, the remote coverage areas 112(1)-112(N) are created by and centered on remote antenna units 114(1)-114(N) coupled to a central unit 116 (e.g., a head-end controller or head-end unit). The central unit 116 may be communicatively coupled to a base station 118. In this regard, the central unit 116 receives analog downlink communications signals 120D from the base station 118 to be distributed to the remote antenna units 114(1)-114(N). The remote antenna units 114(1)-114(N) are configured to receive the downlink communications signals 120D from the central unit 116 over a communications medium 122 to be distributed to the respective coverage areas 112(1)-112(N) of the remote antenna units 114(1)-114(N). Each remote antenna unit 114(1)-114(N) may include one or more RF transmitters/receivers (not shown) and respective antennas 124(1)-124(N) operably coupled to the RF transmitters/receivers to wirelessly distribute the communications services to client devices 126 within their respective coverage areas 112(1)-112(N). The remote antenna units 114(1)-114(N) are also configured to receive analog uplink communications signals 120U from the client devices 126 in their respective coverage areas 112(1)-112(N) to be distributed to the base station 118.

It may be desired to determine information regarding the downlink communications signals 120D and/or the uplink communications signals 120U distributed in the DAS 110 for diagnostic or operational reasons. For example, it may be desired to determine the RF power level of the downlink and/or the uplink communications signals 120D, 120U. The RF power levels may be used to calibrate gain levels in the DAS 110 or determine if any communications component is not distributing a downlink and/or an uplink communications signal 120D, 120U with the proper gain. In this regard, power detectors 60(1)-60(N) (only one power detector, 60(1) is shown) can be provided at specific points in the DAS 110. The power detectors 60(1)-60(N) each provide a respective output signal 128(1)-128(N) (only one output signal, 128(1) is shown) indicative of the RF power in a downlink and/or an uplink communications signal 120D, 120U at such point or location. The output signals 128(1)-128(N) indicative of RF power generated by the power detectors 60(1)-60(N) are also typically analog signals. However, processing these output signals 128(1)-128(N) in a digital domain, such as in an MCU 40 shown in FIG. 7, may be desired. Thus, the ADCs 42(1)-42(N) are employed in FIG. 7 to convert the analog output signals 128(1)-128(N) generated by the power detectors 60(1)-60(N) to respective serial digital data streams DATA1-DATAN (only one serial digital data stream, DATA1 is shown). The MCU 40 may then perform processing, including inter-sample processing (e.g., calculating average power of every stream), of the serial digital data streams DATA1-DATAN collected from the multiple ADCs 42(1)-42(N) at multiple locations in the DAS 110. In FIG. 7, the MCU 40 is shown inside the central unit 116. In this embodiment, the MCU 40 can receive serial digital data streams DATA1-DATAN from ADCs 42(1)-42(N) located in separate remote antenna units 114(1)-114(N) or from multiple ADCs 42(1)-42(N) located in one remote antenna unit 114(1), for example. Also, the MCU 40 can be physically located in different places depending on implementation. For example, the MCU 40 could be located inside remote antenna unit 114(1) and receive serial digital data streams DATA1-DATAN from ADCs 42(1)-42(N) also located inside remote antenna unit 114(1). In this embodiment, each of the ADCs 42(1)-42(N) may be configured to convert a signal from corresponding PDs 60(1)-60(N) associated with different frequency bands.

As one example application of the system 38 (shown in FIG. 2) for simultaneously sampling serial digital data streams DATA1-DATAN from multiple ADCs 42(1)-42(N), it may be desired to measure the power level of a communication signal transmitted or received at each of five antennas, such as antennas 124(1)-124(N) in DAS 110, to provide system feedback information. In the Long Term Evolution (LTE) cellular protocol, data is formatted into LTE symbols with a duration of 71.4 microsecond (μs) (0.5 millisecond (ms)/slot, 7 symbols/slot). If the DAS 110 of FIG. 7 is operating using the LTE cellular protocol, the MCU 40 may need to sample the analog power level of the LTE signal and convert it to a digital format at a rate faster than the symbol rate (faster than one sample per 71.4 μs). Since the system includes multiple frequency bands, in this case five, sampling the LTE signal in multiple circuits belonging to multiple frequency bands may be required. In this example, the MCU 40 may use the readings arriving from the multiple measurement points for calculating peak and average power of the LTE signal or for other tasks, such as automatic level control, overload protection, or others.

Sampling a plurality of measurement points sequentially (as in the prior art) at such a high rate (faster than one sample per 71.4 μs) and providing these samples to an MCU 40 may require the use of a dedicated MCU 40, since the transfer of such high-rate readings to the MCU 40 may keep its serial communication line continuously busy and may require the MCU 40 to stay in an "Interrupt" state during a significant portion of its "real time." For example, in order to sample each signal during each LTE symbol, the corresponding ADCs 42(1)-42(N) may be required to sample each PD 60 every 50 μs to allow the MCU 40 additional time for processing before the next LTE symbol begins. If the MCU 40 must sample each ADC 42 sequentially, each ADC 42 must be sampled within a time frame of 50 μs/5=10 μs. If the data of each sample is provided in twelve bits and four clock cycles are required for the sample to be converted by the ADC 42, then the data rate over a serial communications link will have to be at least (12+4 bits)/10 μs=1.6 Mbps. In this case, the sampling task will keep the MCU 40 continuously busy and will not leave any processing time for other tasks.

In contrast, if an MCU 40 and ADCs 42(1)-42(N) with this data rate are used in the system 38 for simultaneous sampling of serial digital data streams DATA1-DATAN from multiple ADCs 42(1)-42(N) as in FIG. 2, all ADCs 42(1)-42(N) will be sampled simultaneously. Instead of taking 10 μs*5=50 μs to sample the five ADCs 42(1)-42(N), the sampling will only take 10 μs. This leaves an additional 50 μs–10 μs=40 is for the MCU 40 to complete other tasks. This may alleviate the need for a dedicated MCU 40, reducing the cost of the system. Alternatively, or additionally, this improved efficiency may allow for the use of a lower-cost MCU 40 or ADCs 42(1)-42(N) because a high data rate is not required.

Figure 8:
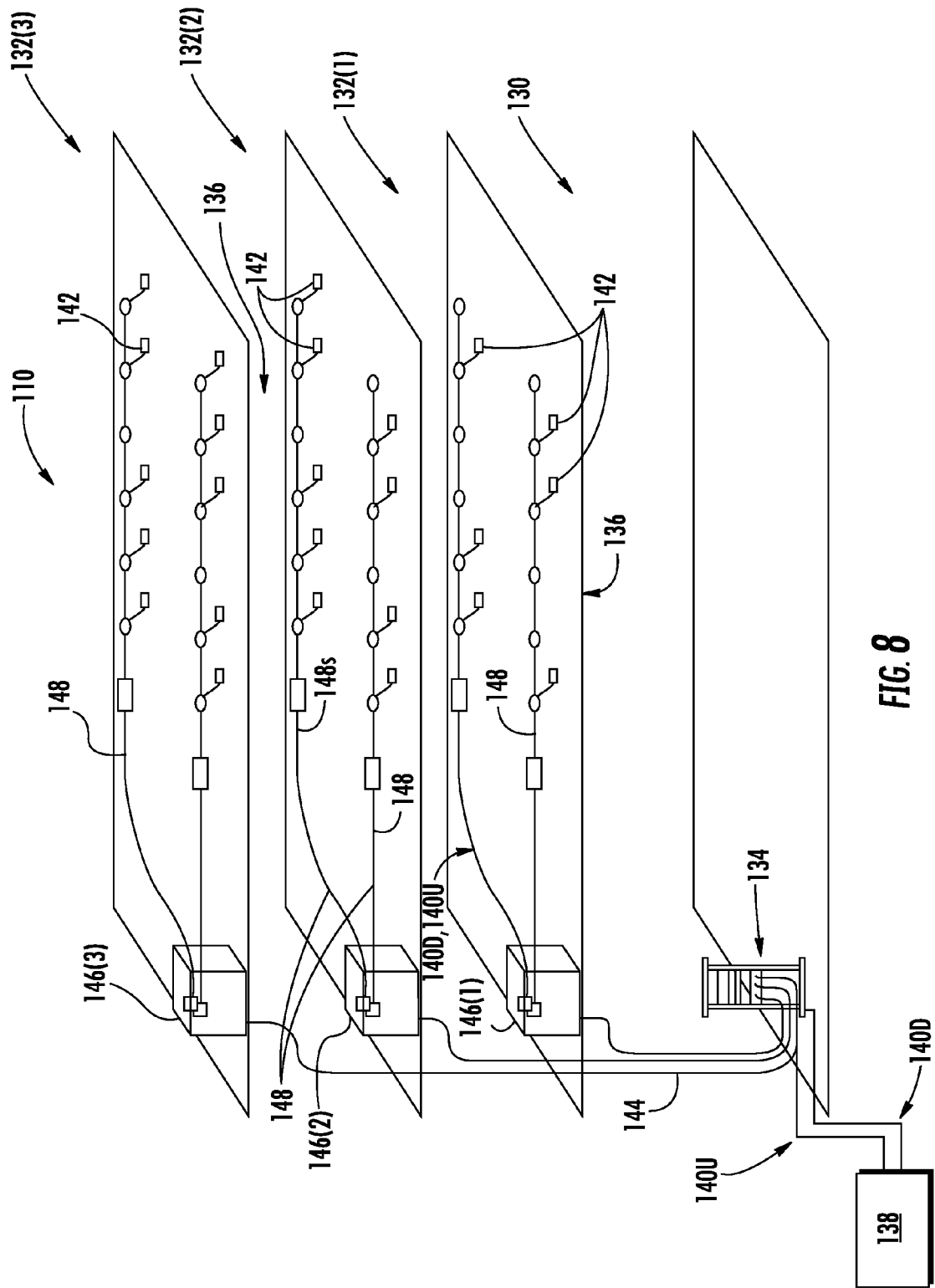
FIG. 8 is a partially schematic cut-away diagram of an exemplary building infrastructure in which the DAS in FIG. 7 can be employed.

The DAS 110 in FIG. 7 may also be provided in an indoor environment, as illustrated in FIG. 8. FIG. 8 is a partially schematic cut-away diagram of a building infrastructure 130 employing the DAS 110 described herein. The building infrastructure 130 in this embodiment includes a first (ground) floor 132(1), a second floor 132(2), and a third floor 132(3). The floors 132(1)-132(3) are serviced by a central unit 134 to provide antenna coverage areas 136 in the building infrastructure 130. The central unit 134 is communicatively coupled to a base station 138 to receive downlink communications signals 140D from the base station 138. The central unit 134 is communicatively coupled to remote antenna units 142 to receive uplink communications signals 140U from the remote antenna units 142, as discussed above. The downlink and uplink communications signals 140D, 140U communicated between the central unit 134 and the remote antenna units 142 are carried over a riser cable 144. The riser cable 144 may be routed through interconnect units (ICUs) 146(1)-146(3) dedicated to each floor 132(1)-132(3) that route the downlink and uplink communications signals 140D, 140U to the remote antenna units 142 and also provide power to the remote antenna units 142 via array cables 148.

Figure 9:
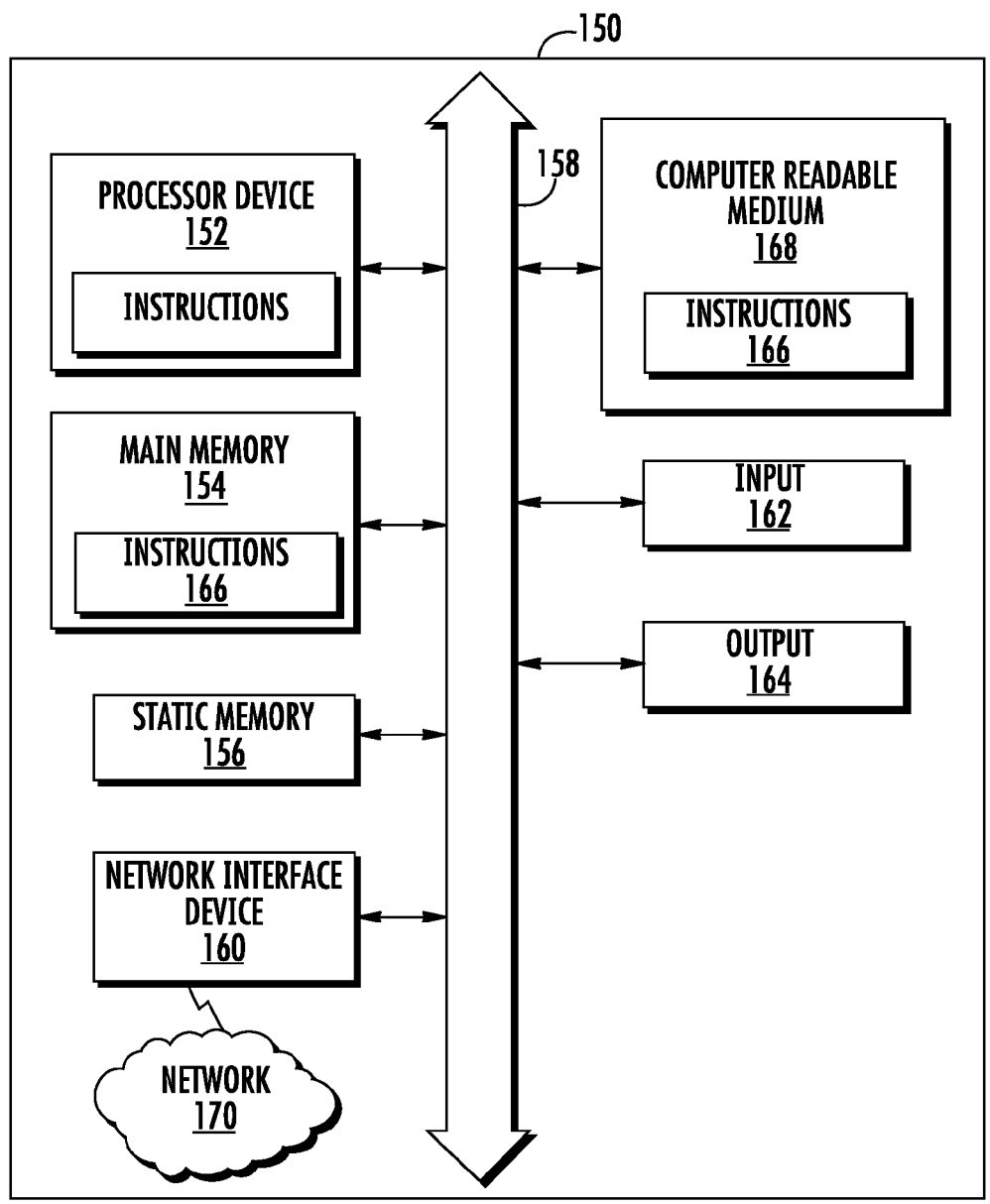
FIG. 9 is a schematic diagram of a generalized representation of an exemplary controller unit that can be included in any central unit, remote unit, wireless client device, and/or any other components of a DAS or other system, for simultaneous sampling of serial digital data streams from multiple ADCs, wherein the exemplary controller unit is adapted to execute instructions from an exemplary computer-readable medium.

In this regard, a controller unit 150 in FIG. 9 may include a set of instructions that may be executed to simultaneously sample serial digital data streams from multiple ADCs. The controller unit 150 may be connected (e.g., networked) to other machines in a LAN, an intranet, an extranet, or the Internet. While only a single device is illustrated, the term "device" shall also be taken to include any collection of devices that individually or jointly execute a set (or multiple sets) of instructions to perform any one or more of the methodologies discussed herein. The controller unit 150 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server or a user's computer.

The exemplary controller unit 150 in this embodiment includes a processing device or processor 152, a main memory 154 (e.g., read-only memory (ROM); flash memory; dynamic random access memory (DRAM), such as synchronous DRAM (SDRAM); etc.), and a static memory 156 (e.g., flash memory, static RAM (SRAM), etc.), which may communicate with each other via a data bus 158. Alternatively, the processor 152 may be connected to the main memory 154 and/or the static memory 156 directly or via some other connectivity means. The processor 152 may be a controller, and the main memory 154 or the static memory 156 may be any type of memory.

The processor 152 represents one or more general-purpose processing devices, such as a microprocessor, central processing unit, or the like. More particularly, the processor 152 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processor 152 is configured to execute processing logic in instructions for performing the operations and steps discussed herein.

The controller unit 150 may further include a network interface device 160. The controller unit 150 also may or may not include an input 162, configured to receive input and selections to be communicated to the controller unit 150 when executing instructions. The controller unit 150 also may or may not include an output 164, including but not limited to a display, a video display unit (e.g., a liquid crystal display (LCD) or a cathode ray tube (CRT)), an alphanumeric input device (e.g., a keyboard), and/or a cursor control device (e.g., a mouse).

The controller unit 150 may or may not include a data storage device that includes instructions 166 stored in a computer-readable medium 168. The instructions 166 may also reside, completely or at least partially, within the main memory 154 and/or within the processor 152 during execution thereof by the controller unit 150, the main memory 154 and the processor 152 also constituting computer-readable media. The instructions 166 may further be transmitted or received over a network 170 via the network interface device 160.

While the computer-readable medium 168 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical media, and magnetic media.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a controller unit (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the controller unit memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A system for simultaneous sampling of serial digital data streams from multiple analog-to-digital converters (ADCs), comprising:
    a controller unit, comprising:
        a chip select output port, a clock output port, and a plurality of data input ports each configured to receive a serial digital data stream; and
        a processor configured to:
            communicate a chip select signal on the chip select output port to receive a serial digital data stream on each of the plurality of data input ports simultaneously; and
            communicate a clock signal on the clock output port; and
    a plurality of ADCs, each ADC among the plurality of ADCs comprising:
        a chip select input port electrically coupled to the chip select output port of the controller unit;
        a clock input port electrically coupled to the clock output port of the controller unit; and
        a data output port electrically coupled to a corresponding data input port among the plurality of data input ports of the controller unit;
        the ADC configured to provide a serial digital data stream on the data output port in response to receiving the clock signal on the clock input port, if the chip select signal is present on the chip select input port.

2. The system of claim 1, wherein the controller unit further comprises a plurality of general purpose input/output (GPIO) pins comprising:
    a first GPIO pin configured as the chip select output port;
    a second GPIO pin configured as the clock output port; and
    a plurality of other GPIO pins configured as the plurality of data input ports.

3. The system of claim 1, wherein each ADC among the plurality of ADCs is further configured to provide the serial digital data stream on the data output port according to a serial peripheral interface (SPI) protocol.

4. The system of claim 1, wherein each ADC among the plurality of ADCs further comprises a data input port electrically coupled to a data output port of the controller unit, and each ADC among the plurality of ADCs is further configured to determine a channel to convert based on a signal received on the data input port.

5. The system of claim 1, wherein each ADC among the plurality of ADCs is further configured to receive an analog signal from a power detector and convert the analog signal received from the power detector to provide the serial digital data stream.

6. The system of claim 1, further comprising a plurality of power detectors,
    wherein:
        each power detector among the plurality of power detectors is disposed at a point in a distributed antenna system (DAS);
        each power detector among the plurality of power detectors detects a power of a communications signal at the point in the distributed antenna system; and
        each ADC among the plurality of ADCs is further configured to receive an analog signal from a corresponding power detector and convert the analog signal received from the power detector to provide the serial digital data stream.

7. The system of claim 6, wherein each power detector among the plurality of power detectors detects a radio frequency (RF) power level of a frequency that is different from the frequency detected by the other power detectors among the plurality of power detectors.

8. The system of claim 6, wherein the distributed antenna system is configured to provide communications services based on a Long Term Evolution (LTE) standard.

9. The system of claim 1, wherein the controller unit is further configured to receive the serial digital data stream on each of the plurality of data input ports at a data rate of at least 1.6 megabits per second (Mbps) and each ADC among the plurality of ADCs is further configured to provide the serial digital data stream on the each of the plurality of data output ports at a data rate of at least 1.6 Mbps.

10. The system of claim 1, wherein the controller unit is further configured to receive the serial digital data stream on each of the plurality of data input ports simultaneously within 50 microseconds (μs).

11. A method for simultaneously sampling serial digital data streams from multiple analog-to-digital converters (ADCs), comprising:
    communicating a chip select signal to a plurality of chip select input ports in a corresponding plurality of ADCs to simultaneously activate the plurality of ADCs;
    communicating a clock signal to a corresponding plurality of clock input ports in the plurality of ADCs;
    simultaneously receiving a plurality of serial digital data streams from the corresponding plurality of ADCs in a corresponding data input port among a plurality of data input ports; and
    simultaneously sampling the plurality of serial digital data streams received in the plurality of data input ports from the plurality of ADCs.

12. The method of claim 11, wherein:
    communicating the clock signal comprises communicating the clock signal comprising clock pulses to a plurality of clock input ports in the plurality of ADCs; and
    simultaneously sampling the plurality of serial digital data streams further comprises simultaneously sampling one bit from each of the plurality of serial digital data streams for each clock pulse of the clock signal.

13. The method of claim 11, further comprising communicating a configuration signal on a data input port of each ADC of the plurality of ADCs to configure which channel of the corresponding ADC to convert, prior to simultaneously receiving the plurality of serial digital data streams.

14. The method of claim 11, further comprising communicating a configuration signal on a data input port of each ADC of the plurality of ADCs to configure a number of bits for the corresponding ADC to provide in the serial digital data stream, prior to simultaneously receiving the plurality of serial digital data streams.

15. The method of claim 11, further comprising communicating a configuration signal on a data input port of each ADC of the plurality of ADCs to configure a method of conversion for the corresponding ADC to provide in the serial digital data stream, prior to simultaneously receiving the plurality of serial digital data streams.

16. The method of claim 11, further comprising not communicating the chip select signal on the chip select input port of each ADC among the plurality of ADCs.

17. A distributed antenna system (DAS), comprising:
a plurality of communications components, comprising:
a central unit configured to receive a downlink communications signal from a communications system and distribute the downlink communications signal over at least one downlink communications medium to a plurality of remote units;
each remote unit among the plurality of remote units configured to receive the downlink communications signal from the central unit over the at least one downlink communications medium and distribute the downlink communications signal to a client device;
a controller unit, comprising:
a chip select output port, a clock output port, and a plurality of data input ports each configured to receive a serial digital data stream; and
a processor configured to:
communicate a chip select signal on the chip select output port to receive a serial digital data stream on each of the plurality of data input ports simultaneously; and
communicate a clock signal on the clock output port; and
a plurality of signal detectors associated with at least one of the plurality of communications components, wherein each signal detector among the plurality of signal detectors comprises:
an interface to receive at least a portion of an analog communications signal from the DAS; and
an analog-to-digital converter (ADC) comprising:
a chip select input port electrically coupled to the chip select output port of the controller unit;
a clock input port electrically coupled to the clock output port of the controller unit; and
a data output port electrically coupled to a corresponding data input port among the plurality of data input ports of the controller unit;
the ADC configured to:
receive an analog signal from the corresponding signal detector; and
convert the analog signal to provide the serial digital data stream on the data output port in response to receiving the clock signal on the clock input port, if the chip select signal is present on the chip select input port.

18. The DAS of claim 17, wherein the central unit is further configured to receive an uplink communications signal from the plurality of remote units over at least one uplink communications medium and distribute the uplink communications signal to the communications system; and each remote unit among the plurality of remote units is configured to receive the uplink communications signal from the client device and distribute the uplink communications signal to the central unit over the at least one uplink communications medium.

19. The DAS of claim 17, wherein each signal detector among the plurality of signal detectors is a power detector.

20. The DAS of claim 19, wherein each analog signal received from the power detector corresponding to each ADC among the plurality of ADCs operates to detect power in a different frequency band.

21. The DAS of claim 17, wherein the DAS is configured to provide communications services based on a Long Term Evolution (LTE) standard.

22. The DAS of claim 17, wherein the controller unit is further configured to receive the serial digital data stream on each of the plurality of data input ports at a data rate of at least 1.6 megabits per second (Mbps) and each ADC among the plurality of ADCs is further configured to provide the serial digital data stream on the data output port at a data rate of at least 1.6 Mbps.

23. The DAS of claim 17, wherein the controller unit is further configured to receive the serial digital data stream on each of the plurality of data input ports simultaneously within 50 microseconds ($\mu s$).

24. The DAS of claim 17, wherein:
the central unit comprises:
at least one electrical-to-optical (E-O) converter configured to convert the received downlink communications signal comprising an electrical downlink communications signal to an optical downlink communications signal, and distribute the optical downlink communications signal, over the at least one downlink communications medium comprising at least one optical downlink communications medium, to the plurality of remote units; and
each remote unit among the plurality of remote units comprises:
at least one optical-to-electrical (O-E) converter configured to convert the received optical downlink communications signal from the central unit over the at least one optical communications medium to an electrical downlink communications signal and distribute the downlink communications signal comprising the electrical downlink communications signal to the client device.

* * * * *